United States Patent
Choi et al.

(10) Patent No.: US 12,230,587 B2
(45) Date of Patent: Feb. 18, 2025

(54) SEMICONDUCTOR DEVICE WITH CRACK-PREVENTING STRUCTURE

(71) Applicant: SAMSUNG ELECTRONICS CO., LTD., Suwon-si (KR)

(72) Inventors: Minjung Choi, Suwon-si (KR); Yeonjin Lee, Suwon-si (KR); Jeonil Lee, Suwon-si (KR); Jongmin Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 17/706,013

(22) Filed: Mar. 28, 2022

(65) Prior Publication Data

US 2023/0067386 A1     Mar. 2, 2023

(30) Foreign Application Priority Data

Aug. 27, 2021   (KR) .......................... 10-2021-0114248

(51) Int. Cl.
| | |
|---|---|
| *H01L 21/78* | (2006.01) |
| *H01L 23/00* | (2006.01) |
| *H01L 23/48* | (2006.01) |
| *H01L 23/522* | (2006.01) |
| *H01L 23/528* | (2006.01) |
| *H01L 23/58* | (2006.01) |

(52) U.S. Cl.
CPC .......... *H01L 23/562* (2013.01); *H01L 23/481* (2013.01); *H01L 23/5226* (2013.01); *H01L 23/528* (2013.01); *H01L 23/585* (2013.01); *H01L 21/78* (2013.01)

(58) Field of Classification Search
CPC . H01L 23/562; H01L 23/481; H01L 23/5226; H01L 23/528; H01L 23/585; H01L 21/78; H01L 2224/0401; H01L 2224/0557; H01L 2224/06181; H01L 2224/16145; H01L 2224/94; H01L 2225/06513; H01L 2225/06541; H01L 2924/3512
See application file for complete search history.

(56) References Cited

U.S. PATENT DOCUMENTS 6,844,612 B1 * 1/2005 Tian .................... H01L 21/3141
                                                          257/634
9,299,629 B2   3/2016 Risaki et al.
(Continued)

FOREIGN PATENT DOCUMENTS

| CN | 112420644 A | 2/2021 |
|---|---|---|
| KR | 10-1742806 | 6/2017 |

*Primary Examiner* — Bitew A Dinke
(74) *Attorney, Agent, or Firm* — Fish & Richardson P.C.

(57) ABSTRACT

A semiconductor device includes; a semiconductor substrate including a chip area and a scribe lane area, a low-k layer on the semiconductor substrate, an interlayer insulating layer on the low-k layer, a trench area in the scribe lane area, a gap-fill insulating layer in the trench area and vertically extending from the semiconductor substrate through the low-k layer and the interlayer insulating layer to expose an upper surface of the gap-fill insulating layer through the interlayer insulating layer, and a first metal liner covering a side surface of the gap-fill insulating layer and disposed between the gap-fill insulating layer and the low-k layer and between the gap-fill insulating layer and the interlayer insulating layer.

6 Claims, 19 Drawing Sheets

(56) References Cited

U.S. PATENT DOCUMENTS

| | | | |
|---|---|---|---|
| 10,553,508 B2 | 2/2020 | Reber et al. | |
| 10,804,206 B2 | 10/2020 | Kuo et al. | |
| 10,910,270 B2 | 2/2021 | Choi et al. | |
| 10,930,602 B2 | 2/2021 | Cho et al. | |
| 2004/0150070 A1* | 8/2004 | Okada | H01L 22/32 257/E23.161 |
| 2005/0269702 A1* | 12/2005 | Otsuka | H01L 23/522 257/E21.582 |
| 2006/0076651 A1* | 4/2006 | Tsutsue | H01L 23/564 257/669 |
| 2009/0065903 A1* | 3/2009 | Tsutsue | H01L 23/585 257/E23.194 |
| 2009/0121321 A1* | 5/2009 | Miccoli | G03F 9/7084 257/E23.179 |
| 2009/0155982 A1* | 6/2009 | Wakisaka | H01L 21/561 257/E21.214 |
| 2009/0256260 A1* | 10/2009 | Nakamura | H01L 27/14683 257/431 |
| 2009/0289325 A1* | 11/2009 | Wang | H01L 23/562 257/E29.02 |
| 2010/0006984 A1* | 1/2010 | Watanabe | H01L 24/05 257/E23.194 |
| 2010/0123219 A1* | 5/2010 | Chen | B23K 26/40 257/E23.08 |
| 2011/0169159 A1* | 7/2011 | Lin | H01L 24/19 257/692 |
| 2012/0241914 A1* | 9/2012 | Yook | H01L 23/3178 257/E23.179 |
| 2013/0001787 A1* | 1/2013 | Yoshizawa | H01L 23/564 257/E23.072 |
| 2015/0123285 A1* | 5/2015 | Lin | H01L 27/14636 257/774 |
| 2016/0035639 A1* | 2/2016 | Wu | H01L 23/3114 438/114 |
| 2016/0260674 A1* | 9/2016 | Jones | H01L 21/76898 |
| 2017/0053902 A1* | 2/2017 | Yu | H01L 23/481 |
| 2017/0186704 A1* | 6/2017 | Sakuma | H01L 21/78 |
| 2017/0271389 A1* | 9/2017 | Yamamoto | H01L 27/14621 |
| 2018/0096952 A1* | 4/2018 | Miccoli | H01L 23/562 |
| 2019/0035736 A1* | 1/2019 | Kuo | H01L 21/76229 |
| 2020/0126930 A1* | 4/2020 | Cho | H01L 23/3114 |
| 2021/0057328 A1* | 2/2021 | Lee | H01L 23/5222 |
| 2021/0384093 A1* | 12/2021 | Verma | H01L 23/3157 |
| 2022/0051993 A1* | 2/2022 | Chen | H01L 23/562 |
| 2022/0122885 A1* | 4/2022 | Du | H01L 23/562 |
| 2022/0336372 A1* | 10/2022 | Yamaguchi | H01L 23/544 |
| 2022/0336373 A1* | 10/2022 | Yamaguchi | H01L 23/544 |
| 2022/0344278 A1* | 10/2022 | Yamaguchi | H01L 23/544 |

* cited by examiner

SEMICONDUCTOR DEVICE WITH CRACK-PREVENTING STRUCTURE

CROSS-REFERENCE TO RELATED APPLICATION

This application claims priority under 35 U.S.C. § 119 to Korean Patent Application No. 10-2021-0114248 filed on Aug. 27, 2021 in the Korean Intellectual Property Office, the subject matter of which is hereby incorporated by reference in its entirety.

BACKGROUND

The inventive concept relates generally to semiconductor devices, and more particularly, to semiconductor devices including a crack-preventing structure.

With the rapid development of the electronics industry and consumer demands for expanded functionality, electronic devices have become lighter and more compact. Accordingly, semiconductor chips incorporated within electronic devices are required with increased integration density. As a result, design rules associated with the constituent elements and components of semiconductor chips have decreased in dimension(s). In addition, a low-k material layer has been introduced into semiconductor chips in order to reduce parasitic capacitance between wirings and improve a resistance-capacitance (RC) delay.

Of further note, semiconductor chips are usually fabricated as a group on a wafer. Thereafter, once a group of semiconductor chips has been successfully fabricated and wafer-level tested, the respective semiconductor chips are separated (or singulated). In order to prevent cracking or chipping of semiconductor chips during singulation, certain methods (e.g., laser cutting) have been introduced to replace previously used mechanical cutting methods that apply a sawing blade to the wafer.

SUMMARY

Embodiments, of the inventive concept provide semiconductor devices including a structure that substantially prevents cracking of semiconductor chip during singulation from a wafer.

According to an aspect of the inventive concept, a semiconductor device may include; a semiconductor substrate including a chip area and a first scribe lane area, a low-k layer on the semiconductor substrate, an interlayer insulating layer on the low-k layer a first trench area in the first scribe lane area, a first gap-fill insulating layer in the first trench area and vertically extending from the semiconductor substrate through the low-k layer and the interlayer insulating layer to expose an upper surface of the first gap-fill insulating layer through the interlayer insulating layer, wherein a first metal liner covers a side surface of the first gap-fill insulating layer and is disposed between the first gap-fill insulating layer and the low-k layer and between the first gap-fill insulating layer and the interlayer insulating layer.

According to an aspect of the inventive concept, a semiconductor device may include; a semiconductor substrate including a chip area and a second scribe lane area, a low-k layer on the semiconductor substrate, an interlayer insulating layer on the low-k layer, an aluminum (Al) pad disposed in the second scribe lane area in the interlayer insulating layer above the low-k layer, and a second metal liner in the second scribe lane area and vertically extending from the Al pad through the interlayer insulating layer.

According to an aspect of the inventive concept, a semiconductor device may include; a semiconductor substrate including a chip area, a first scribe lane area and a second scribe lane area, a low-k layer on the semiconductor substrate, and an interlayer insulating layer on the low-k layer. The first scribe lane area may include; a first trench area, a first gap-fill insulating layer in the first trench area and vertically extending from the semiconductor substrate through the low-k layer and the interlayer insulating layer to expose an upper surface of the first gap-fill insulating layer through the interlayer insulating layer, and a first metal liner covering a side surface of the first gap-fill insulating layer and disposed between the first gap-fill insulating layer and the low-k layer and between the first gap-fill insulating layer and the interlayer insulating layer. The second scribe area may include; a second trench area on the Al pad, and a second gap-fill insulating layer vertically extending from the Al pad through the interlayer insulating layer to expose an upper surface of the second gap-fill insulating layer through the interlayer insulating layer.

BRIEF DESCRIPTION OF THE DRAWINGS

Various advantages, features and related aspects of the inventive concept may be more clearly understood upon consideration of the following detailed description together with the accompanying drawings, in which:

FIGS. 2A and 2B are respective cross-sectional views further illustrating the semiconductor device of FIG. 1, wherein FIG. 2A shows a wafer state before singulation of semiconductor chips, and FIG. 2B shows a chip state of a semiconductor chip after singulation from the wafer;

FIGS. 3A and 3B are respective cross-sectional views of a semiconductor device including a crack-preventing structure according to embodiments of the inventive concept, wherein FIG. 3A shows a wafer state before singulation of semiconductor chips, and FIG. 3B shows a wafer of a semiconductor chip after singulation from the wafer;

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
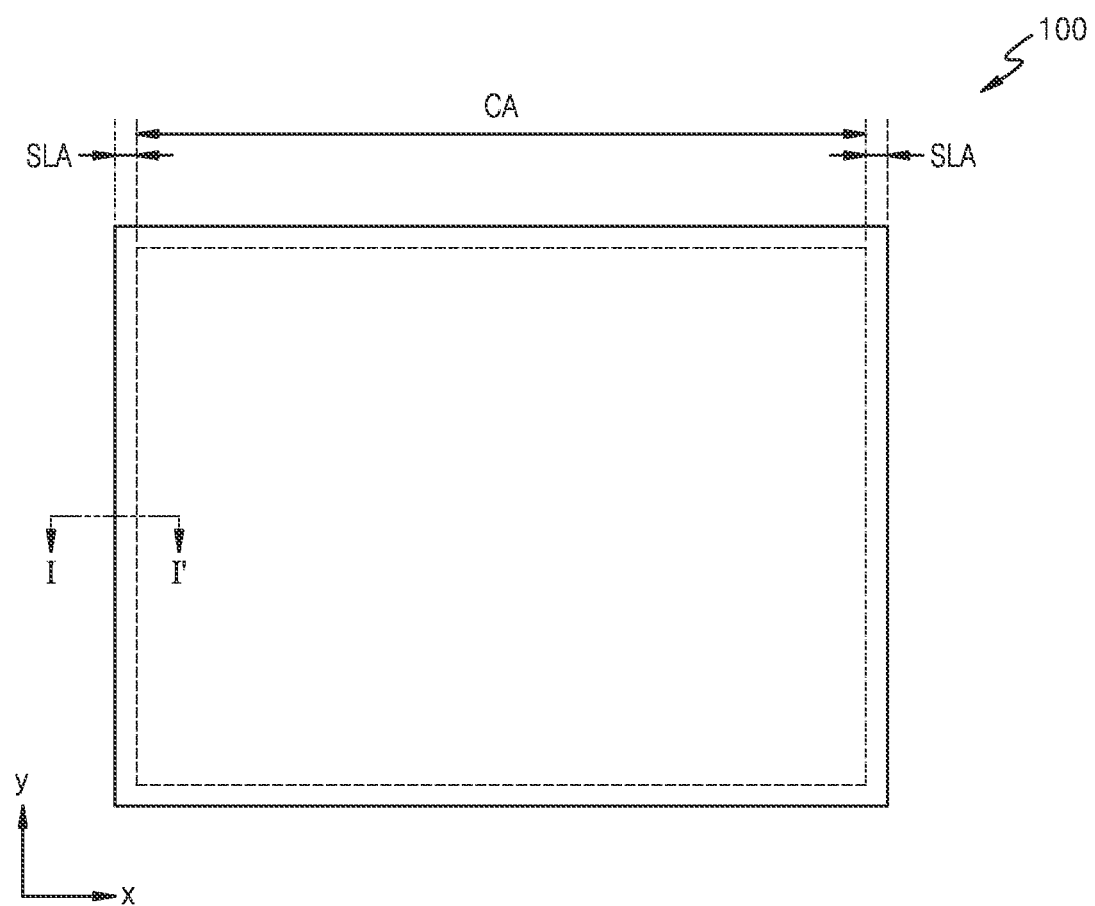
FIG. 1 is a plan view of a semiconductor device including a crack-preventing structure according to embodiments of the inventive concept.
Figure 2A:
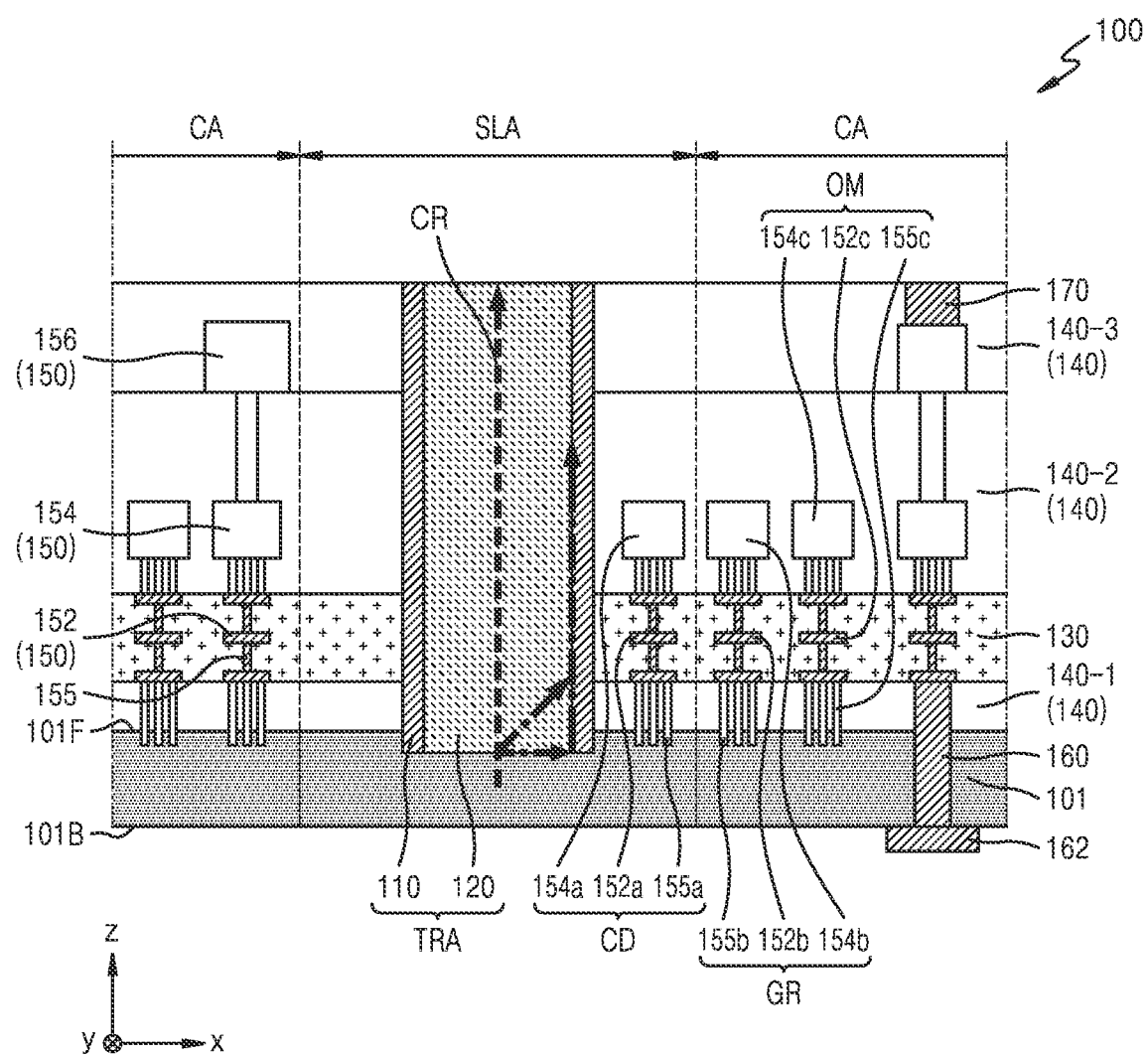
Figure 2B:
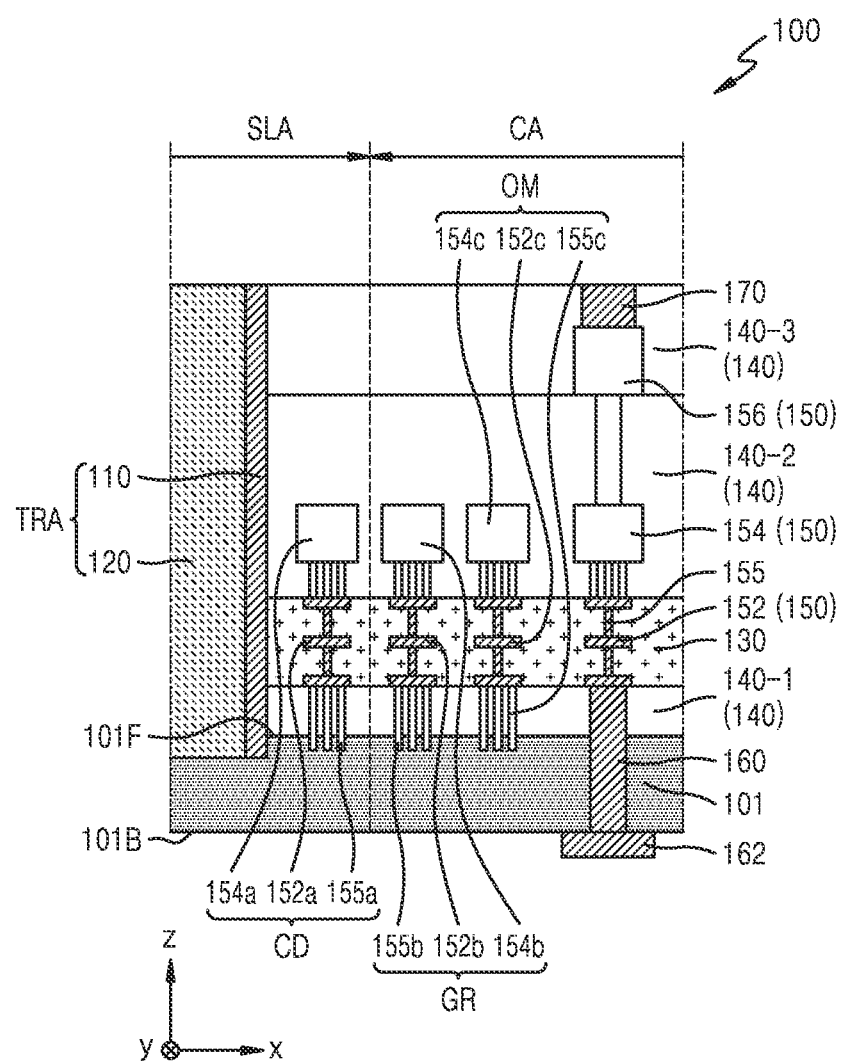

FIG. 1 is a plan view of a semiconductor device 100 including a crack-preventing structure according to embodiments of the inventive concept, FIG. 2A is a cross-sectional view taken along line I-I' of FIG. 1 and further illustrates a wafer state before semiconductor chips are singulated, and FIG. 2B is a cross-sectional view taken along line I-I' of FIG. 1 and further illustrates a chip state of a semiconductor chip after singulation from the wafer.

Referring collectively to FIGS. 1, 2A and 2B, the semiconductor device 100 may generally include a chip area CA and a scribe lane area SLA. The chip area CA may be a central portion of the semiconductor device 100 wherein a plurality of integrated circuits may be fabricated along with a number of interconnection lines 150 (e.g., an interconnection line structure 150 including, for example, lower interconnection lines 152, intermediate interconnection lines 154 and upper interconnection lines 156). In contrast, the scribe lane area SLA may be arranged substantially around (or surrounding) the chip area CA. Indeed, as shown in FIG. 2A, the scribe lane area SLA associated with the semiconductor device 100 may correspond, at least in part, to the scribe lane area SLA of the wafer.

The chip area CA and the scribe lane area SLA may be defined on a semiconductor substrate 101. Here, the semiconductor substrate 101 may include at least one of, for example, silicon (Si), germanium (Ge), silicon carbide (SiC), gallium arsenide (GaAs), indium arsenide (InAs), and indium phosphide (InP). In various embodiments, the semiconductor substrate 101 may have a silicon-on-insulator (SOI) structure, include a buried oxide (BOX) layer, and/or include a conductive region (e.g., an impurity-doped well or an impurity-doped structure). Additionally or alternately, the semiconductor substrate 101 may include various isolation structures, such as shallow trench isolation (STI) structure(s).

The semiconductor substrate 101 may be understood as including an active surface 101F and an opposing inactive surface 101B. Various integrated circuits may be formed on/in the active surface 101F. Here, the active surface 101F may correspond to the upper surface of the semiconductor substrate 101, and the inactive surface 101B may correspond to the lower surface of the semiconductor substrate 101.

The integrated circuits may include various memory devices and/or logic devices. The memory devices may include, for example, a dynamic random access memory (RAM) (DRAM) device, a static RAM (SRAM) device, a flash memory device, an electrically erasable and programmable read-only memory (EEPROM) device, a phase-change RAM (PRAM) device, a magnetic RAM (MRAM) device, and/or a resistive RAM (RRAM) device. The logic devices may include, for example, an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FIL), a multiplexer (MXT/MXIT), an OR/AND/inverter (OAI) gate, an AND/OR (AO) gate, an AND/OR/inverter (AOI) gate, a D flip-flop, a reset flip-flop, a master-slave flip-flop, a latch, and/or a counter. The logic devices may further include a central processor unit (CPU), a microprocessor unit (MPU), a graphics processor unit (GPU), and/or an application processor (AP).

A low-k layer 130, an interlayer insulating layer 140, and interconnection lines 150 may be on the semiconductor substrate 101. In some embodiments, the interlayer insulating layer 140 may include a first interlayer insulating layer 140-1, a second interlayer insulating layer 140-2, and a third interlayer insulating layer 140-3. However, the number of individual insulating layers constituting the interlayer insulating layer 140 is a matter of design choice.

In some embodiments, the interlayer insulating layer 140 may include at least one of, for example, tetraethyl orthosilicate (TEOS), silicon oxide, phosphosilicate glass (PSG), borophosphosilicate glass (BPSG), undoped silicate glass (USG), plasma enhanced-TEOS (PE-TEOS), and high density plasma-chemical vapor deposition (HDP-CVD).

The low-k layer 130 may be between the first interlayer insulating layer 140-1 and the second interlayer insulating layer 140-2. Here, the low-k layer 130 may be provided to reduce parasitic capacitance and/or improve a resistance-capacitance (RC) delay. The low-k layer 130 may include an insulating material having a permittivity lower than that of silicon oxide ($SiO_2$). In some embodiments, the low-k layer 130 may include a material having an ultra-low dielectric constant ranging from about 2.2 to about 2.4. In some embodiments, the low-k layer 130 may include a silicon oxide film including carbon (C) or hydrocarbon ($C_xH_y$). For example, the low-k layer 130 may include an SiOC film or an SiCOH film.

The interconnection lines 150 (or the interconnection line structure 150) may include lower interconnection line(s) 152, intermediate interconnection line(s) 154, and/or upper interconnection line(s) 156. The lower interconnection lines 152 may be disposed within the low-k layer 130, the intermediate interconnection lines 154 may be disposed within the second interlayer insulating layer 140-2, and the upper interconnection lines 156 may be disposed within the third interlayer insulating layer 140-3. However, those skilled in the art will recognize that the number, composition, arrangement and/or disposition of the interconnection lines 150 and/or the interlayer insulating layers is a matter of design choice. Two or more vertically adjacent interconnection lines 150 may be variously connected through a vertical contact 155, and interconnection lines 150 may be variously connected to integrated circuits on the semiconductor substrate 101 through the vertical contact(s) 155.

In some embodiments, the interconnection lines 150 and vertical contacts 155 may include at least one metal, such as for example, aluminum (Al), copper (Cu), and tungsten (W). In some embodiments, the interconnection lines 150 and the vertical contact 155 may further include a barrier layer and/or an interconnection metal layer. The barrier layer may include at least one metal, such as for example, Al, W, titanium (Ti), tantalum (Ta), ruthenium (Ru), manganese (Mn), and cobalt (Co). Alternately or additionally, the barrier layer may include a metal nitride, metal oxide and/or metal alloy of the foregoing metal, such as for example, cobalt tungsten phosphide (CoWP), cobalt tungsten boron (CoWB), and cobalt tungsten boron phosphide (CoWBP). The interconnection metal layer may include at least one metal, such as for example, W, Al, Ti, Ta, Ru, Mn, and Cu.

The upper interconnection lines 156 may correspond to a redistribution line or an interconnection line associated with a pad or a bump. That is, a pad or a bump may be connected to one or more of the upper interconnection lines 156. In the illustrated semiconductor device 100 of FIG. 2A, a Cu pad 170 is assumed to connect an upper interconnection line 156. Thus, the Cu pad 170 may extend at least partially through the third interlayer insulating layer 140-3, such that an upper surface of the Cu pad 170 is exposed through the third interlayer insulating layer 140-3. In some embodiments, the Cu pad 170 may include a barrier layer and a Cu layer. For example, the barrier layer may include a metal such as Ti, Ta, Al, Ru, Mn, Co, or W; or nitride or oxide of same. The Cu pad 170 may substitute for a bump when semiconductor devices are stacked.

Through silicon vias (TSVs) 160 may variously extend through the semiconductor substrate 101 in the chip area CA to connect electrode pad(s) 162 disposed on a lower surface of the semiconductor substrate 101. Thus, the TSVs 160 may variously connect one or more of the lower interconnection lines 152 with one or more electrodes pads 162. Alternately or additionally, the TSVs 160 may variously connect one or more of the intermediate interconnection lines 154 and/or one or more of the upper interconnection lines 156.

An outer metal interconnection line OM and a guard ring GR may also be disposed in the chip area CA of the semiconductor device 100. In this regard, the outer metal interconnection line OM may have structure substantially similar to that of the interconnection lines 150, and may in some embodiments be formed simultaneously with (i.e., by the same fabrication process(es)) the formation of the interconnection lines 150. Hence, in some embodiments, the outer metal interconnection line OM may include lower interconnection lines 152c, intermediate interconnection lines 154c, and vertical contact(s) 155c. Of note in relation to embodiments of the inventive concept, the outer metal interconnection line OM may be used to effectively sense cracking during singulation of semiconductor chips from a wafer.

The guard ring GR may be used to inhibit or prevent cracking of the scribe lane area SLA from penetrating into the chip area CA. The guard ring GR may have a structure substantially similar to that of the interconnection lines 150, and may be formed simultaneously with the interconnection lines 150. For example, the guard ring GR may include lower interconnection lines 152b, intermediate interconnection lines 154b, and a vertical contact 155b.

A chipping dam CD may be provided in the scribe lane area SLA, adjacent to the guard ring GR. The chipping dam CD may have a structure substantially similar to that of the guard ring GR and may inhibit or completely prevent cracking in the scribe lane area SLA from penetrating into the chip area CA. For example, the chipping dam CD may include lower interconnection lines 152a, intermediate interconnection lines 154a, and a vertical contact 155a.

In this regard, the chipping dam CD and the guard ring GR may be disposed laterally (e.g., in at least one of a first horizontal direction and a second horizontal direction) with respect to a trench area TRA in FIG. 2A (e.g., a first trench area TRA). Further in this regard, multiple chipping dam(s) and/or multiple guard ring(s) may be variously disposed in relation to the trench area TRA or some other are or feature of particular concern. For example a single chipping dam CD and a single guard ring GR may be laterally disposed to one side of the trench area TRA, or multiple chipping dams CD and multiple guard rings GR may be laterally and disposed to different sides of the trench area TRA.

Of additional note, the scribe lane area SLA is an area designated for the separation (e.g., cutting or dicing) of semiconductor chips one from another during a singulation process. Thus, by design and prior designation no material portion of an integrated circuit—including the interconnection lines 150—is usually provided within the scribe lane area SLA.

Accordingly, as shown in FIG. 2A, the scribe lane area SLA may be disposed between two semiconductor chips adjacently disposed on a wafer. And as shown in FIG. 2B, at least a portion of the scribe lane area SLA may remain as an outer edge portion of the semiconductor device 100 once the semiconductor chip 100 has been singulated. However, similarly fabricated interconnection line structures (and related pads or bumps) that do not provide an electrical connection within the semiconductor device 100 may be arranged in the scribe lane area SLA. Therefore, in some embodiments, one or more chipping dams CD, related pads or bumps (see, e.g., the Al pad 190 of FIG. 3A), and/or dummy interconnection lines (see, e.g., dummy interconnection line 195 of FIG. 3A) may be variously disposed in the scribe lane area SLA.

Referring to FIG. 1, in some embodiment, a continuous scribe lane area SLA may surround on four sides the chip area CA. Here, the scribe lane areas SLA respectively corresponding to the four sides of the chip area CA may have different widths. Such width variations may be caused by asymmetric structure(s) of the scribe lane areas SLA and/or the shape (or path) of cracking CR that occurs during a grinding process applied to the semiconductor device 100 following a laser (GAL) cutting process.

The semiconductor device 100 may correspond to a semiconductor chip separated from the wafer through a GAL sawing process or a GAL cutting process. One example of a GAL cutting process will be described hereafter.

With the demand for high-capacity and high-density semiconductor devices, the dimension(s) of various scribe lane areas SLA provide on a wafer are decreasing. In general, a wafer may be singulated into individual semiconductor chips using a mechanical cutting method that uses a sawing blade. However, mechanical cutting methods tend to increase the risk of damaging integrated circuits due to stress applied to the semiconductor substrate during the mechanical cutting process. In some cases, a semiconductor chip may or fracture due to stress cracking.

Accordingly, other wafer cutting processes using a laser as a cutting implement, instead of the saw blade, have been recently introduced. During cutting of a wafer using a laser, a laser beam having a wavelength capable of penetrating the semiconductor substrate 101 may be directed (or radiated) onto a scribe lane area SLA of the semiconductor substrate 101 in order to singulate the semiconductor device 100 from the wafer (e.g., a water state process). As the laser beam is radiated onto the scribe lane area SLA, a modified layer may be formed in the semiconductor substrate 101 along the scribe lane area SLA. Depending on the positioning of the laser beam relative to the semiconductor substrate 101, the cutting action of the laser and the resulting modified layer may vary between the active surface 101F or the inactive surface 101B of the substrate 101.

After the modified layer is formed in response to the laser cutting, the inactive surface 101B of the semiconductor substrate 101 may be polished, and may as a result of the polishing, cause cracking CR in the scribe lane area SLA. For example, as indicated by the bold dashed line of FIG. 2A, cracking CR may propagate from the active surface 101F towards the active surface 101F, the low-k layer 130 and the interlayer insulating layer 140 in the vertical (or Z) direction perpendicular to the semiconductor substrate 101. That is, when the inactive surface 101B of the semiconductor substrate 101 is polished, the thickness (e.g., measured in the vertical direction) of the semiconductor substrate 101 may be reduced, but cracking CR may propagate from the modified layer into the low-k layer 130 and/or the interlayer insulating layer 140.

Here, polishing may include a grinding process performed in a state in which physical pressure is applied to the semiconductor substrate 101. When polishing is performed in the state in which physical pressure is applied to the semiconductor substrate 101, the semiconductor substrate 101 may suffer from a brittle fracture (or cracking) without apparent and/or permanent deformation if the applied force exceeds an elastic limit of constituent materials. That is, during grinding of the inactive surface 101B of the semiconductor substrate 101, the semiconductor substrate 101 may get thinner and suffer a brittle fracture as cracking CR propagates outwardly from the modified layer.

In this regard, a protective sheet may be attached to the wafer before grinding, and accordingly, even when semiconductor chips separate by a brittle fracture, the semiconductor chips do not break away from their original positions, but remain fixed by the protective sheet. In some embodiments, the modified layer may be completely removed by continuously grinding the inactive surface 101B of the semiconductor substrate 101. That is, the semiconductor substrate 101 may be polished to a thickness of about 100 μm or less, and in some embodiments, the semiconductor substrate 101 may be polished to a thickness of about 20 μm to about 50 μm.

In the end, the GAL cutting process may refer to a cutting process carried out by grinding after laser radiation. The GAL cutting process may minimize a width of a portion, which is cut away from the semiconductor substrate 101, by singulating the wafer into semiconductor chips through laser radiation and grinding. Accordingly, as compared with mechanical cutting methods using a sawing blade, the width of the scribe lane area SLA may be significantly decreased, and the chip area CA of the semiconductor device 100 may be increased. As a result, more integrated circuits may be formed in the chip area CA.

In some embodiments, the trench area TRA may be disposed in the scribe lane area SLA of the semiconductor device 100. The trench area TRA may have a certain width in a first horizontal (or X) direction and extend in a certain length in the second (or Y) direction. The trench area TRA may include a metal liner 110 (e.g., a first metal liner 110) and a gap-fill insulating layer 120 (e.g., a first gap-fill insulating layer 120). The metal liner 110 and the gap-fill insulating layer 120 may extend from the semiconductor substrate 101 in the vertical (or Z) direction and extend through the low-k layer 130 and the interlayer insulating layer 140. In some embodiments, the metal liner 110 and the gap-fill insulating layer 120 may extend from the first interlayer insulating layer 140-1 in the vertical (or Z) direction and extend through the low-k layer 130 and the second and third interlayer insulating layers 140-2 and 140-3. That is, the lower surface of the metal liner 110 and the gap-fill insulating layer 120 may be slightly separated from the active surface 101F of the semiconductor substrate 101.

In the wafer state shown in FIG. 2A, the metal liner 110 may cover each of opposing side surfaces of the gap-fill insulating layer 120. However, in the semiconductor chip state shown in FIG. 2B, the metal liner 110 may cover a side surface of the gap-fill insulating layer 120 at the side of the chip area CA, while the opposing side surface of the gap-fill insulating layer 120 is exposed.

Here, the gap-fill insulating layer 120 may include TEOS, silicon oxide, PSG, BPSG, USG, PE-TEOS, or HDP-CVD.

The metal liner 110 may include at least one of, for example, Ti, Ta, titanium nitride (TiN), tantalum nitride (TaN), and Al, and may be formed as a single film or as multiple films. The metal liner 110 may include the same material as the barrier layer of the Cu pad 170. However, the material of the metal liner 110 is not limited to those above.

The trench area TRA in the scribe lane area SLA may be formed to prevent cracking CR from penetrating into the chip area CA during the GAL cutting process. That is, should cracking CR in the semiconductor substrate 101 reach the interface between the low-k layer 130 and the interlayer insulating layer 140, the cracking CR may then extend along the interface in a horizontal direction. In this manner, cracking CR may penetrate into the chip area CA.

Of further note in relation to the subject detailed description, when cracking CR is said to extend in "a horizontal direction", it should be understood that such cracking extends in at least one of the first and second horizontal directions, or that the cracking extend in a direction having a horizontal component that extends in at least one of the first and second horizontal directions.

In some embodiments, the interface between the low-k layer 130 and the interlayer insulating layer 140 may be obviated in this regard by forming the trench area TRA in a region wherein cracking CR is likely to occur (e.g., the scribe lane areas SLA of the semiconductor device 100). Accordingly, cracking CR may be inhibited or prevented from extending in a lateral direction along the interface between the low-k layer 130 and the interlayer insulating layer 140. And as a result, cracking CR will not penetrate into the chip area CA.

When the trench area TRA is formed, an interface may be formed between the semiconductor substrate 101 and the gap-fill insulating layer 120 or between the gap-fill insulating layer 120 and the interlayer insulating layer 140. Thus, should the trench area TRA includes only the gap-fill insulating layer 120, cracking CR may nonetheless extend in a lateral direction along such interfaces and penetrate into the chip area CA.

However, in some embodiments, the trench area TRA of the semiconductor device 100 may further include the metal liner 110 covering side surfaces of the gap-fill insulating layer 120. For example, as shown by the bold long-short dashed lines in FIG. 2A, any cracking CR that should extend in a lateral along the interface between the semiconductor substrate 101 and the gap-fill insulating layer 120 from the interface therebetween may be redirected in the vertical direction along a vertically-extending interface between the gap-fill insulating layer 120 and the metal liner 110. As a result, cracking CR will not penetrate into the chip area CA.

According to various embodiments of the inventive concept, the semiconductor device 100 may include the low-k layer 130 disposed on (or above) the semiconductor substrate 101, and may be singulated using a GAL cutting process. Hence, the semiconductor device 100 may include the trench area TRA disposed in an area wherein cracking CR is most likely to occur (i.e., the scribe lane area SLA). Further, the trench area TRA may include the metal liner 110 as well as the gap-fill insulating layer 120. Accordingly, the semiconductor device 100 may have a structure, in which the interface between the low-k layer 130 and the interlayer insulating layer 140 is obviated from considerations of cracking CR and the direction of same. This is true because the direction of any horizontal cracking will be redirected by the vertically-extending interface between the metal liner 110 and the gap-fill insulating layer 120. In this manner, cracking CR that may otherwise extend in a lateral direction between (e.g.,) the semiconductor substrate 101 and the gap-fill insulating layer 120, or between the interlayer insulating layer 140 and the gap-fill insulating layer 120 may be effectively inhibited or prevented, such that the cracking CR does not penetrate into the chip area CA.

In some embodiments, for example, the semiconductor device 100 may be a DRAM device including one or more DRAM chips. For example, the semiconductor device 100 may be a high-bandwidth memory (HBM) DRAM chip implemented in in a HBM package. Here, the HBM package may include a base chip and a plurality of DRAM chips stacked on the base chip. In some embodiments, the bases chip may be a buffer chip or a control chip, such that the base chip controls communication (e.g., transmitting and/or receiving) of various command, control power, address and/or data signals associated with the DRAM chips. The HBM package may be manufactured by stacking individual DRAM chips on respective base chips, once the DRAM chips have been fabricated on a wafer, sealed on the wafer for protection, and then singulated from the wafer. The process of stacking the DRAM chips on the wafer may be referred to as a die-to-wafer (D2W) process. Accordingly, the semiconductor device 100 may be used for the manufacture of the HBM package using the D2W process.

Figure 3A:
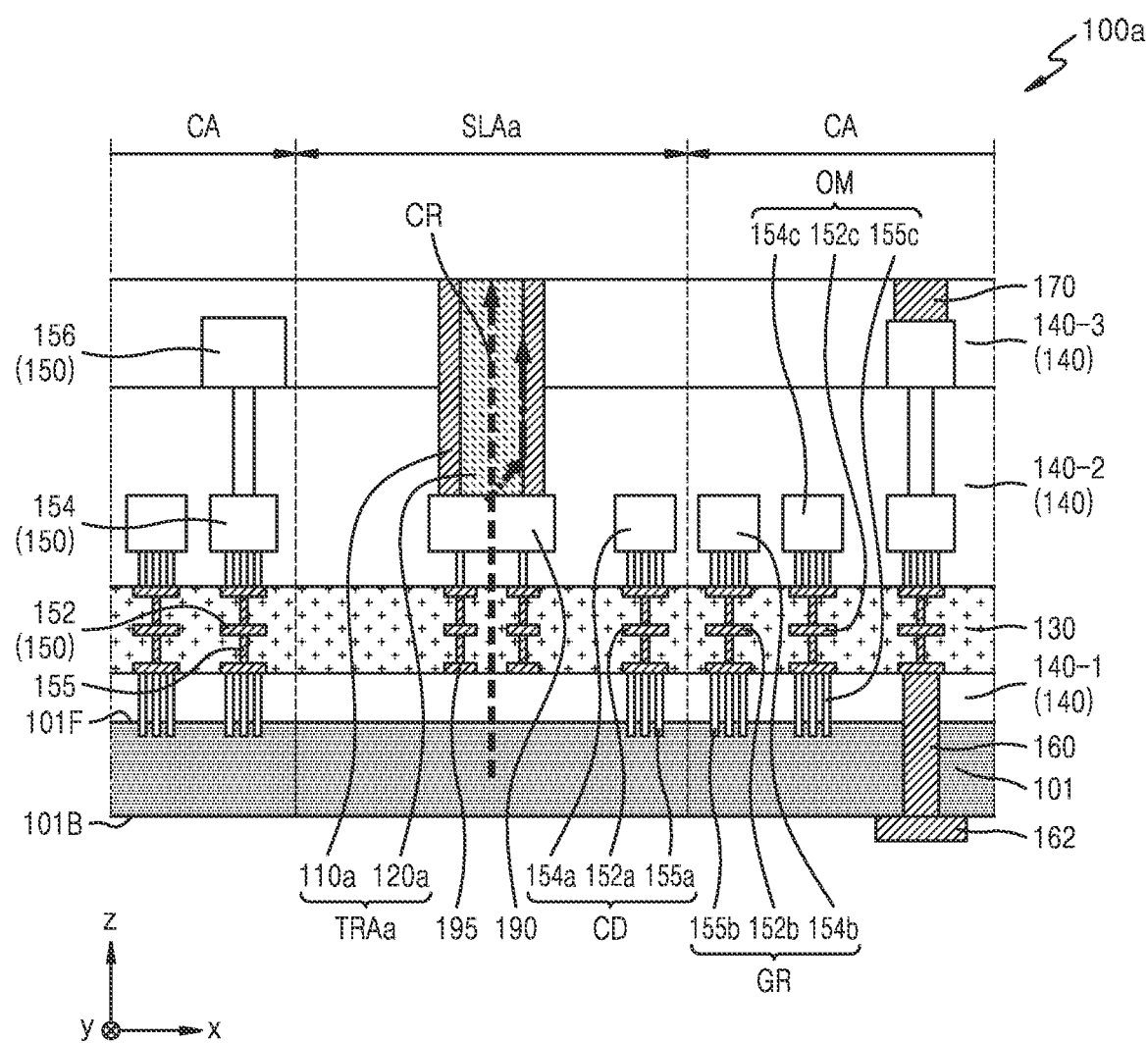
Figure 3B:
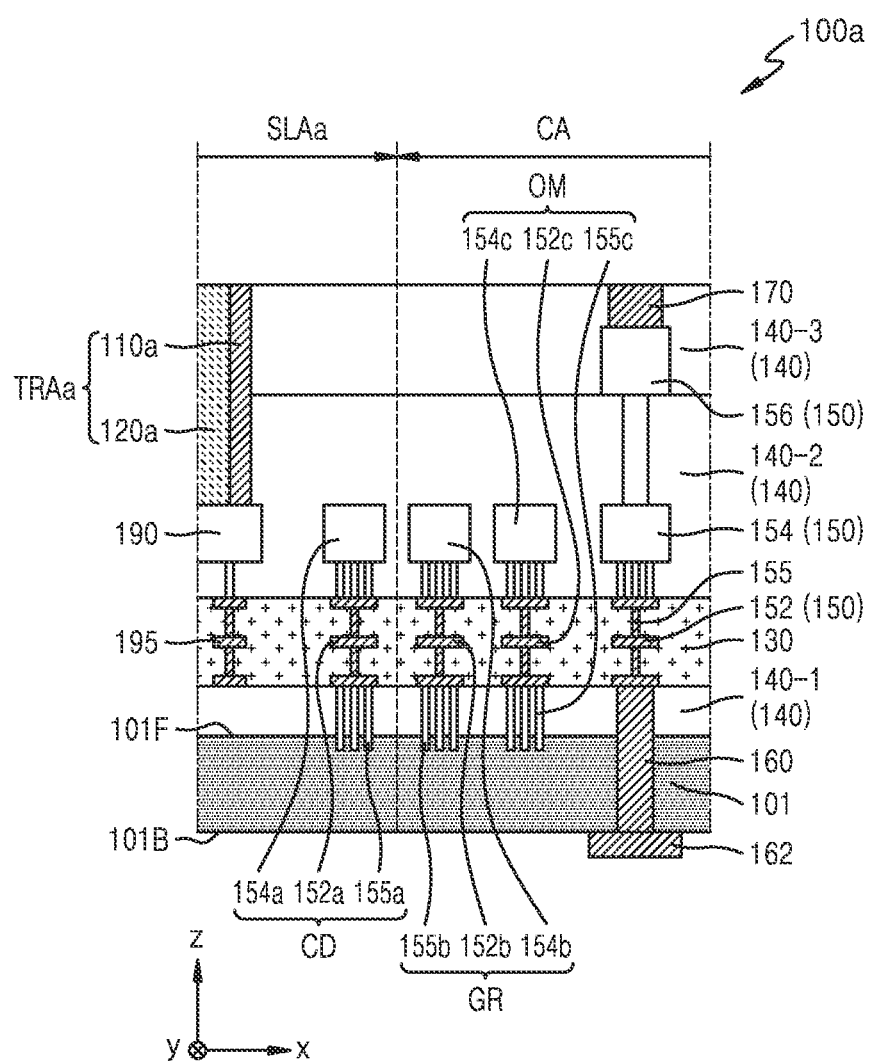

FIGS. 3A and 3B are respective cross-sectional views of a semiconductor device 100a including a crack-preventing structure according to embodiments of the inventive concept. Here, FIG. 3A shows a wafer state before singulation of semiconductor chips, and FIG. 3B shows a chip state of a semiconductor chip following singulation from the wafer.

Referring to FIGS. 3A and 3B, the semiconductor device 100a may be understood as being substantially similar to the semiconductor device 100 of FIG. 2A except for the particular structure of a scribe lane area SLAa. Here, an Al pad 190 and an overlaying trench area TRAa (e.g., a second trench area TRAa) may be disposed in the scribe lane area SLAa of the semiconductor device 100a. As described above, the scribe lane area SLAa may be an area in which integrated circuits and the interconnection lines 150 are not disposed. However, a pattern—which may be used to test electrical characteristics of an integrated circuit in a wafer state, or a mark—which may be used for alignment purposes when multiple pattern layers are formed, may be disposed in the scribe lane area SLAa. For example, the Al pad 190 and a dummy interconnection line 195 may be disposed in the scribe lane area SLAa, wherein the Al pad 190 and the dummy interconnection line 195 may constitute a test element group (TEG) or an alignment key.

The trench area TRAa may be formed on the Al pad 190 and may vertically extend from the AL pad 190 to extend through the second and third interlayer insulating layers 140-2 and 140-3. Here again, the (second) trench area TRAa may include a metal liner 110a (e.g., a second metal liner 110a) and a gap-fill insulating layer 120a (e.g., a second gap-fill insulating layer 120a). The gap-fill insulating layer 120a may vertically extend from the Al pad 190, and the upper surface of the gap-fill insulating layer 120a may be exposed through an upper surface of the third interlayer insulating layer 140-3. The metal liner 110a may also vertically extend from the Al pad 190 to cover side surfaces of the gap-fill insulating layer 120a.

Thus, within the semiconductor device 100a, the trench area TRAa may be formed on the Al pad 190 and may include the metal liner 110a and the gap-fill insulating layer 120a. Accordingly, any cracking CR that extends in a lateral direction along the interface between the Al pad 190 and the gap-fill insulating layer 120a, or laterally along the interface therebetween may be redirected in the vertical direction by the vertically-extending interface between the gap-fill insulating layer 120a and the metal liner 110a. As a result, cracking CR may be prevented from penetrating into the chip area CA. In addition, the direction of cracking CR may be redirected (or changed) at the interface between the low-k layer 130 and the interlayer insulating layer 140 below the Al pad 190. However, cracking CR may be blocked by the dummy interconnection line 195 from extending laterally along the interface between the low-k layer 130 and the interlayer insulating layer 140 to potentially penetrate into the chip area CA.

The semiconductor device 100a of FIGS. 3A and 3B may be distinguished from the semiconductor device 100 of FIGS. 2A and 2B by the inclusion (or absence) of the Al pad 190 within the scribe lane areas SLA or SLAa. In some embodiments, a semiconductor device according to embodiments of the inventive concept may include both a first scribe lane area SLA without the Al pad 190, and a second scribe lane area SLAa including the Al pad 190. For example, the first and second scribe lane areas SLA and SLAa may be respectively used in different areas of the substrate 101 (e.g., on different sides (or edges) of the chip area CA). Alternately, both the first scribe lane area SLA and the second scribe lane area SLAa may be used on a same side of the chip area CA. In this case, a cross-sectional view of a semiconductor device may be different according to which scribe lane area is cut. That is, when a semiconductor device includes both the first scribe lane area SLA and the second scribe lane area SLAa, a cross-sectional view taken in the scribe lane area SLA may correspond to FIG. 2A or 2B, and a cross-sectional view taken in the scribe lane area SLAa may correspond to FIG. 3A or 3B.

FIGS. 4A to 4F are related cross-sectional views illustrating in one example a method of manufacture for the semiconductor device 100 of FIGS. 2A and 2B.

Figure 4A:
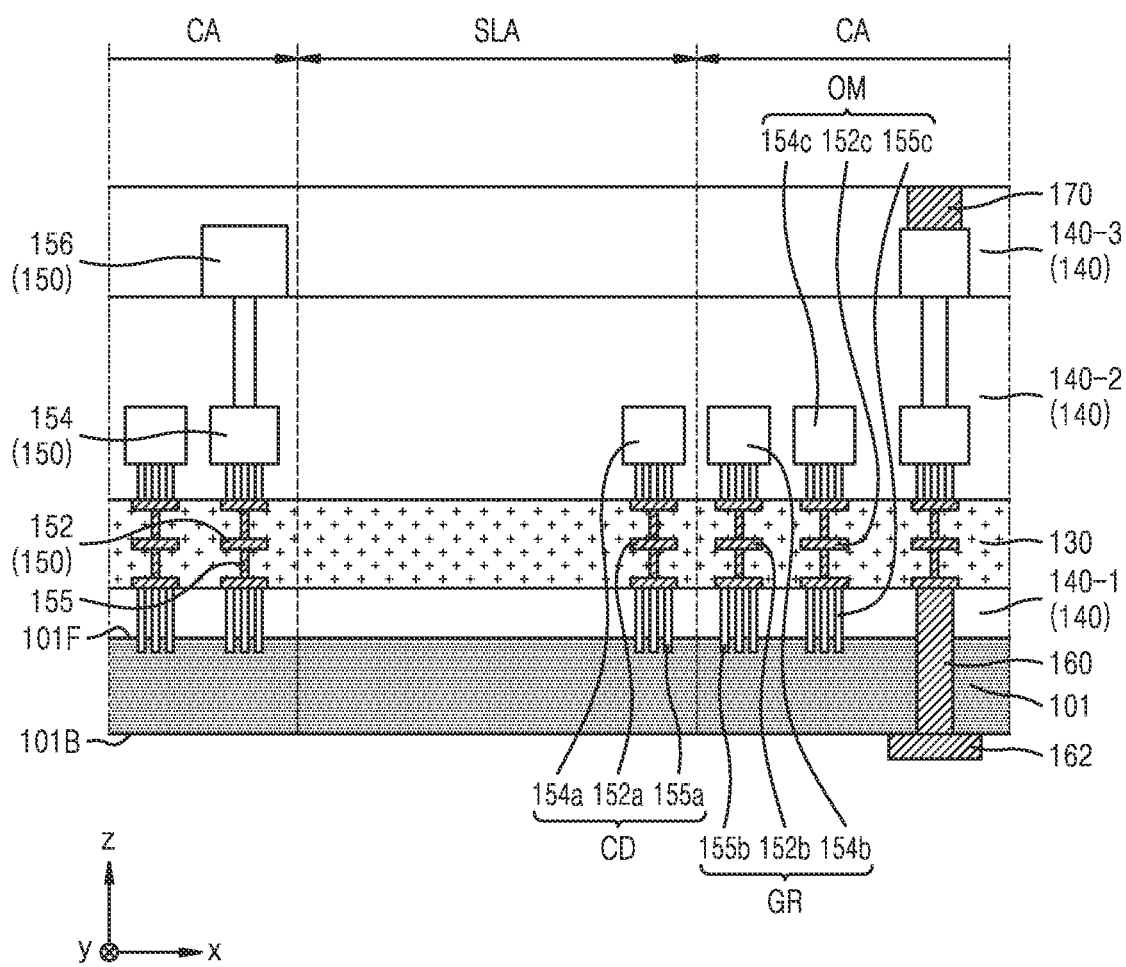
FIGS. 4A, 4B, 4C, 4D, 4E and 4F (hereafter collectively, "FIGS. 4A to 4F") are related cross-sectional views illustrating a method of manufacture for the semiconductor device of FIG. 2B.

In the context of FIGS. 1, 2B and 2B, and referring to FIG. 4A, integrated circuits, the low-k layer 130, the interlayer insulating layer 140, the interconnection lines 150, the TSV 160, and the Cu pad 170 are formed on the semiconductor substrate 101. When the interconnection lines 150 are formed, the outer metal interconnection line OM and the guard ring GR of the chip area CA and the chipping dam CD of the scribe lane area SLA may be simultaneously formed. In this context, the term "simultaneously formed" denotes formation of elements and/or components as the result of performing a same sequence of fabrication process(es).

The Cu pad 170 may be formed by forming a groove in the third interlayer insulating layer 140-3 to expose the upper surface of the upper interconnection line 156, and then filling the groove with a Cu layer. In some embodiments, the Cu pad 170 may be formed by forming a barrier layer in the groove and then forming the Cu layer on the barrier layer.

Figure 4B:
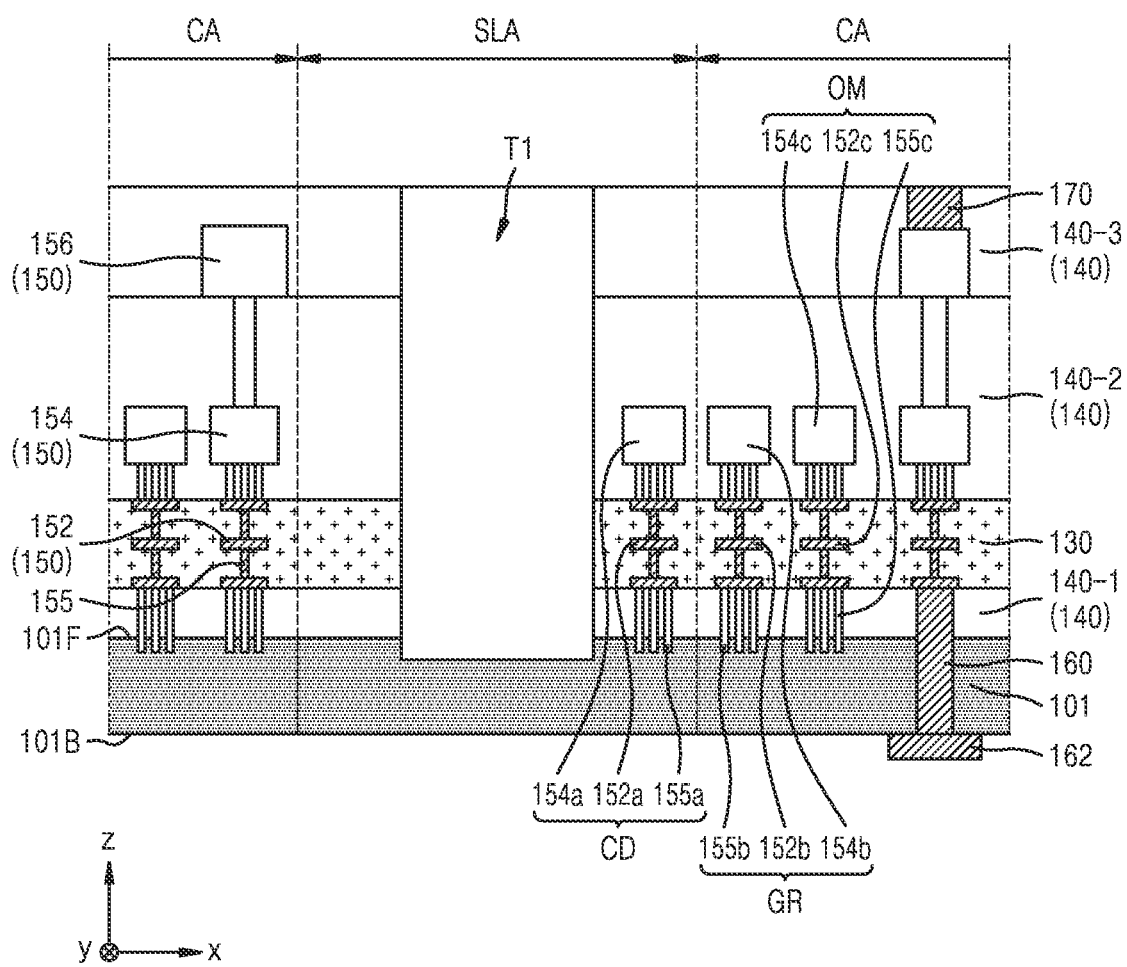

Referring to FIG. 4B, a first trench T1 is formed in the scribe lane area SLA. The first trench T1 may be formed to extend through the low-k layer 130 and the interlayer insulating layer 140 to expose the upper surface (i.e., the active surface) 101F of the semiconductor substrate 101. As shown in FIG. 4B, the formation of the first trench T1 may also form a recess of predetermined depth in the upper surface of the semiconductor substrate 101.

Alternately, in some embodiments, the first trench T1 may be formed down to the first interlayer insulating layer 140-1. In this case, a recess having a certain depth may be formed in the upper surface of the first interlayer insulating layer 140-1, and the upper surface of the semiconductor substrate 101 is not exposed.

Figure 4C:
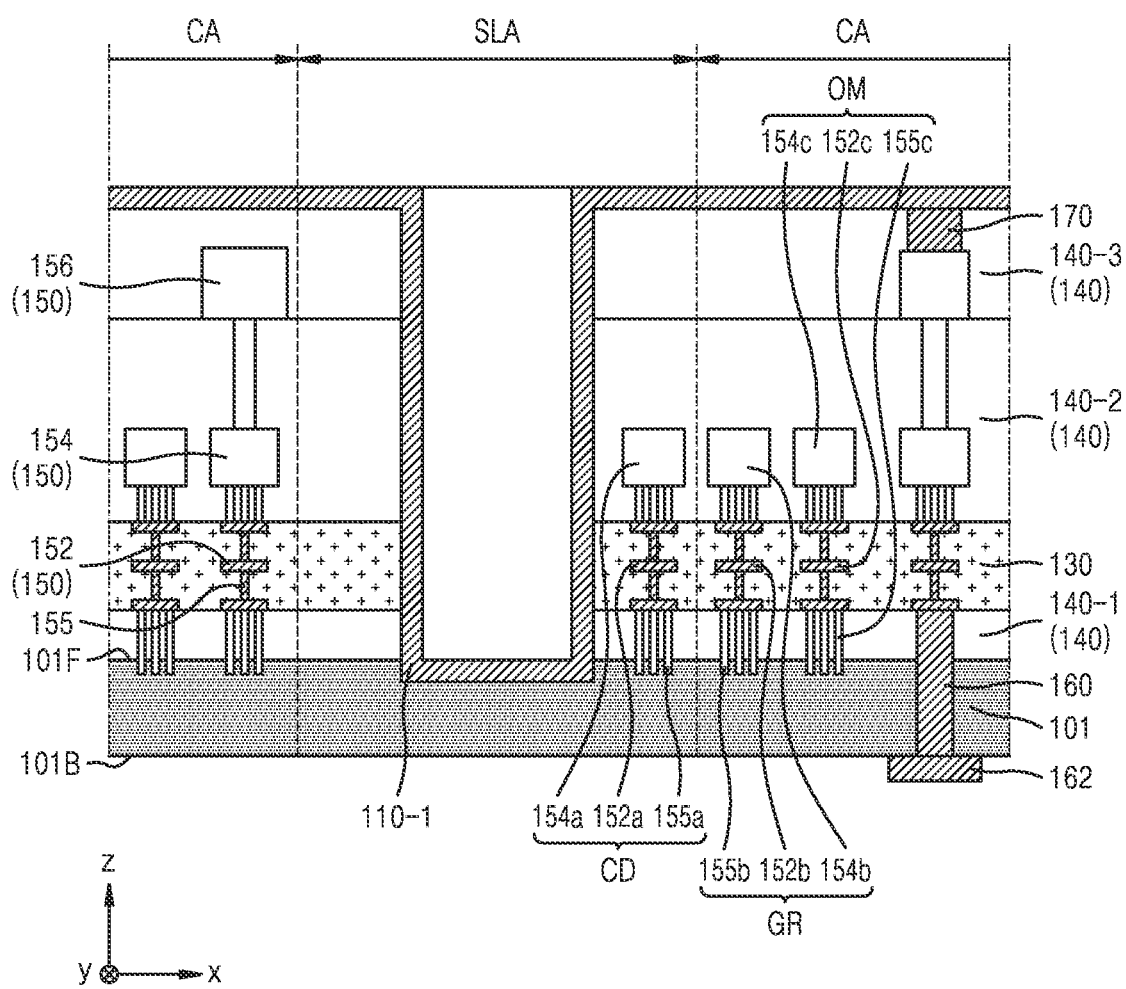

Referring to FIG. 4C, a metal layer is formed to cover the lower surface and inner side walls of the first trench T1 to a certain thickness. The metal layer 110-1 may extend along the upper surface of the interlayer insulating layer 140, e.g., the third interlayer insulating layer 140-3, and the upper surface of the Cu pad 170. That is, the metal layer 110-1 may be formed to entirely cover a structure on the semiconductor substrate 101.

The metal layer 110-1 may be formed as a single film or multiple films with the metal materials of the metal liner 110 described above. For example, the metal layer 110-1 may include at least one material, such as for example Ti, TiN, Ta, TaN, and Al. The metal layer 110-1 may include the same material as the barrier layer of the Cu pad 170.

Figure 4D:
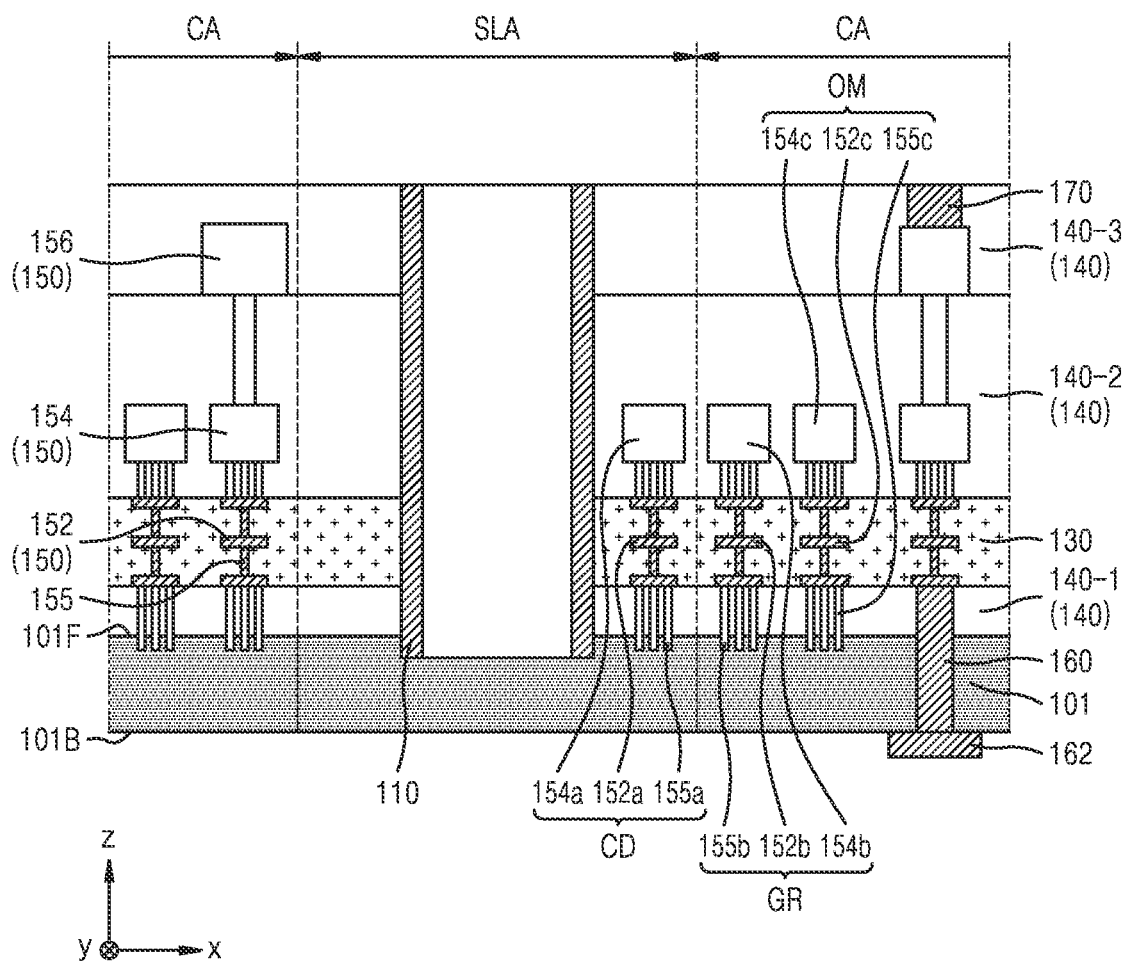

Referring to FIG. 4D, a horizontally disposed portion of the metal layer 110-1 on the lower surface of the first trench T1, a horizontally disposed portion of the metal layer 110-1 on the upper surface of the third interlayer insulating layer 140-3, and a portion of the metal layer 110-1 on the upper surface of the Cu pad 170 may be removed by etching. For example, the portions of the metal layer 110-1 may be removed by dry etching. In some embodiments, wherein the width (e.g., a dimension measured in the first horizontal direction) of the first trench T1 is relatively wide, the foregoing portions of the metal layer 110-1 may be removed by an etch back process. In this manner, the metal liner 110 may be formed by selectively removing portions of the metal layer 110-1.

When the first trench T1 is formed to expose the upper surface of the semiconductor substrate 101, the upper surface of the semiconductor substrate 101 may be exposed by removing the portions of the metal layer 110-1, as shown in FIG. 4D. However, when the first trench T1 is formed to expose the upper surface of the first interlayer insulating layer 140-1, the upper surface of the first interlayer insulating layer 140-1 may be exposed by removing the portions of the metal layer 110-1.

Figure 4E:
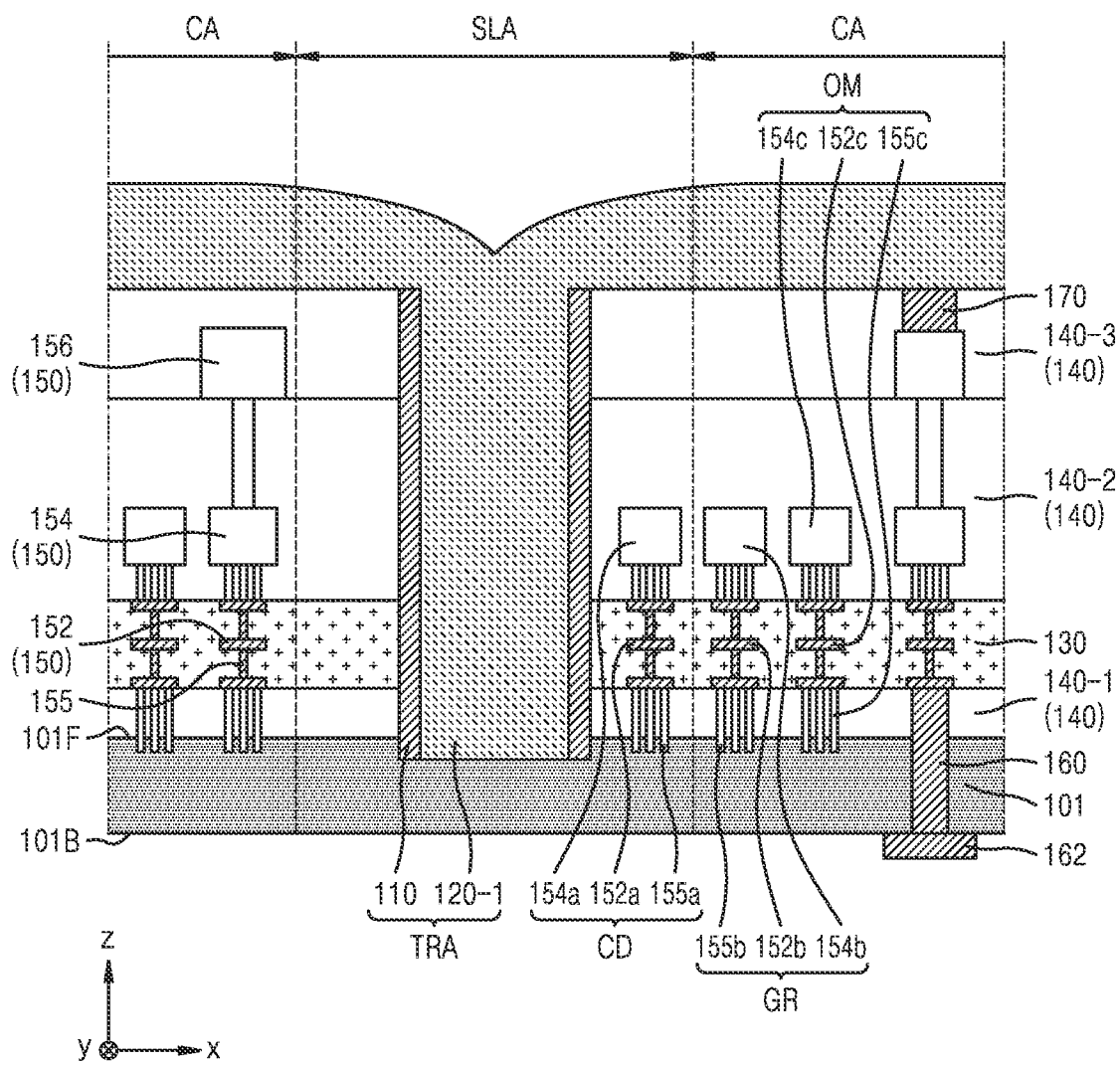

Referring to FIG. 4E, after the metal liner 110 is formed, the first trench T1 may be filled with an insulating layer 120-1. The insulating layer 120-1 may be formed thickly to completely fill the first trench T1. Accordingly, portions of the insulating layer 120-1 may be disposed on the upper surface of the third interlayer insulating layer 140-3 and the upper surface of the Cu pad 170. For example, the insulating layer 120-1 may include TEOS. However, embodiments are not limited thereto. The insulating layer 120-1 may include a silicon oxide film.

Figure 4F:
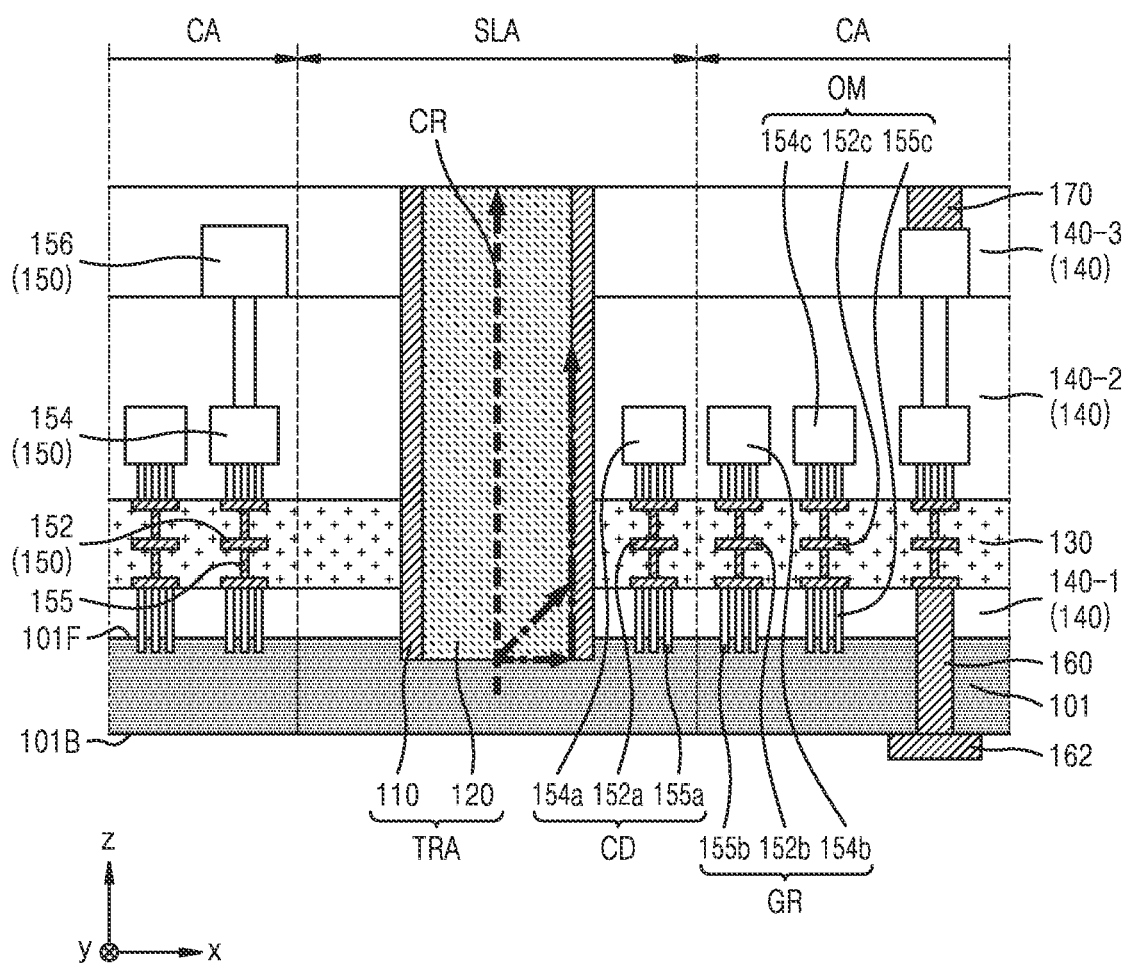

Referring to FIG. 4F, the portions of the insulating layer 120-1 on the upper surface of the third interlayer insulating layer 140-3 and on the Cu pad 170 may be removed by a chemical mechanical polishing (CMP) process. That is, the gap-fill insulating layer 120 may be formed by removing the portions of the insulating layer 120-1 above the completely filled trench area TRA. As shown in FIG. 4F, the trench area TRA may vertically extend from the upper surface of the semiconductor substrate 101 and extend through the low-k layer 130 and the interlayer insulating layer 140. However, when the first trench T1 is formed to expose the upper surface of the first interlayer insulating layer 140-1, the filled trench area TRA may vertically extend from the upper surface of the first interlayer insulating layer 140-1 and extend through the low-k layer 130 and the second and third interlayer insulating layers 140-2 and 140-3.

As the portions of the insulating layer 120-1 are removed by the CMP process, the respective upper surfaces of the metal liner 110, the gap-fill insulating layer 120, the third interlayer insulating layer 140-3, and the Cu pad 170 may be made substantially coplanar. various layers (e.g., the metal liner 110 and the Cu pad 170) including different material(s) than the insulating layer 120-1 may act as etch stop layers during the CMP process. After the trench area TRA is formed, a GAL cutting process may be performed to singulate individual semiconductor chips from the wafer to yield (e.g.,) the semiconductor device 100 of FIG. 2B.

Figure 5A:
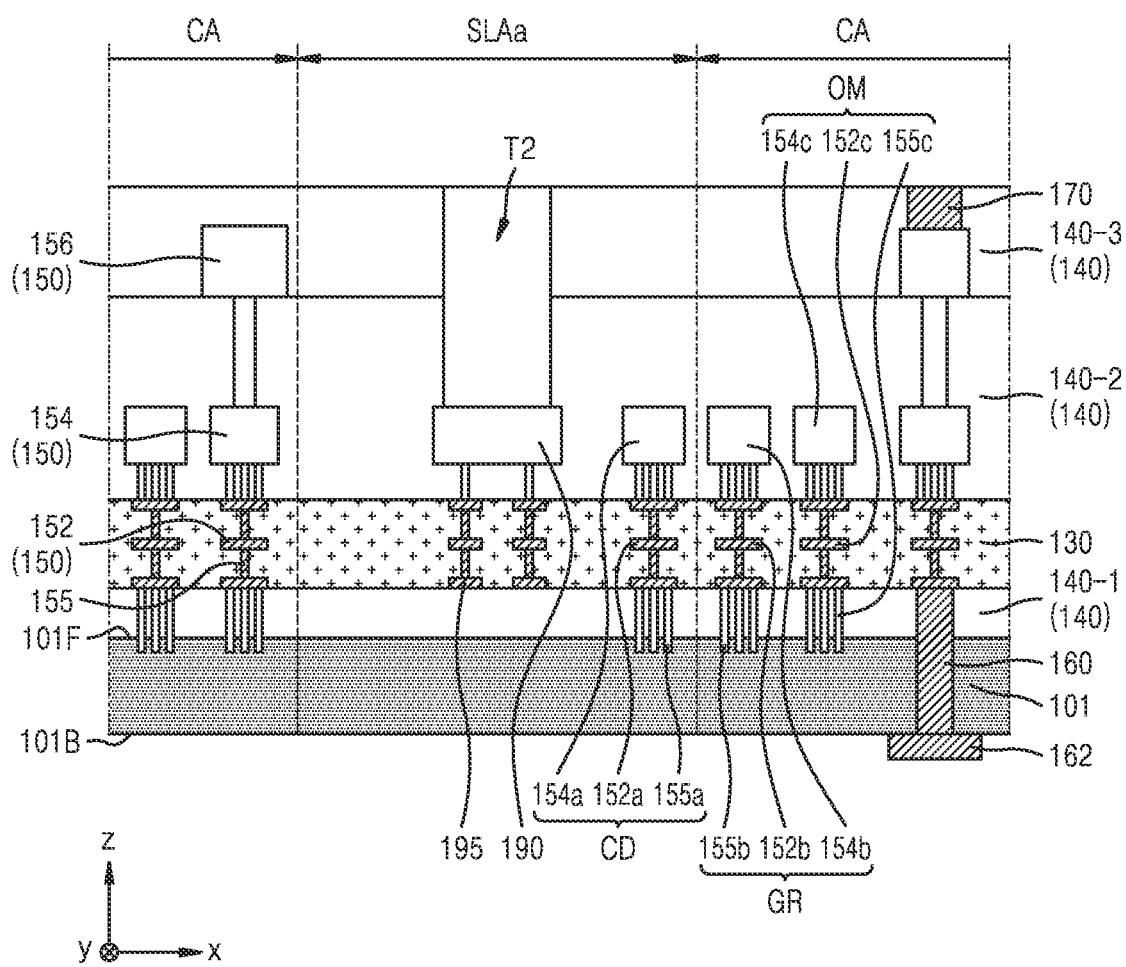
FIGS. 5A, 5B and 5C are related cross-sectional views illustrating a method of manufacture for the semiconductor device of FIG. 3B.
Figure 5B:
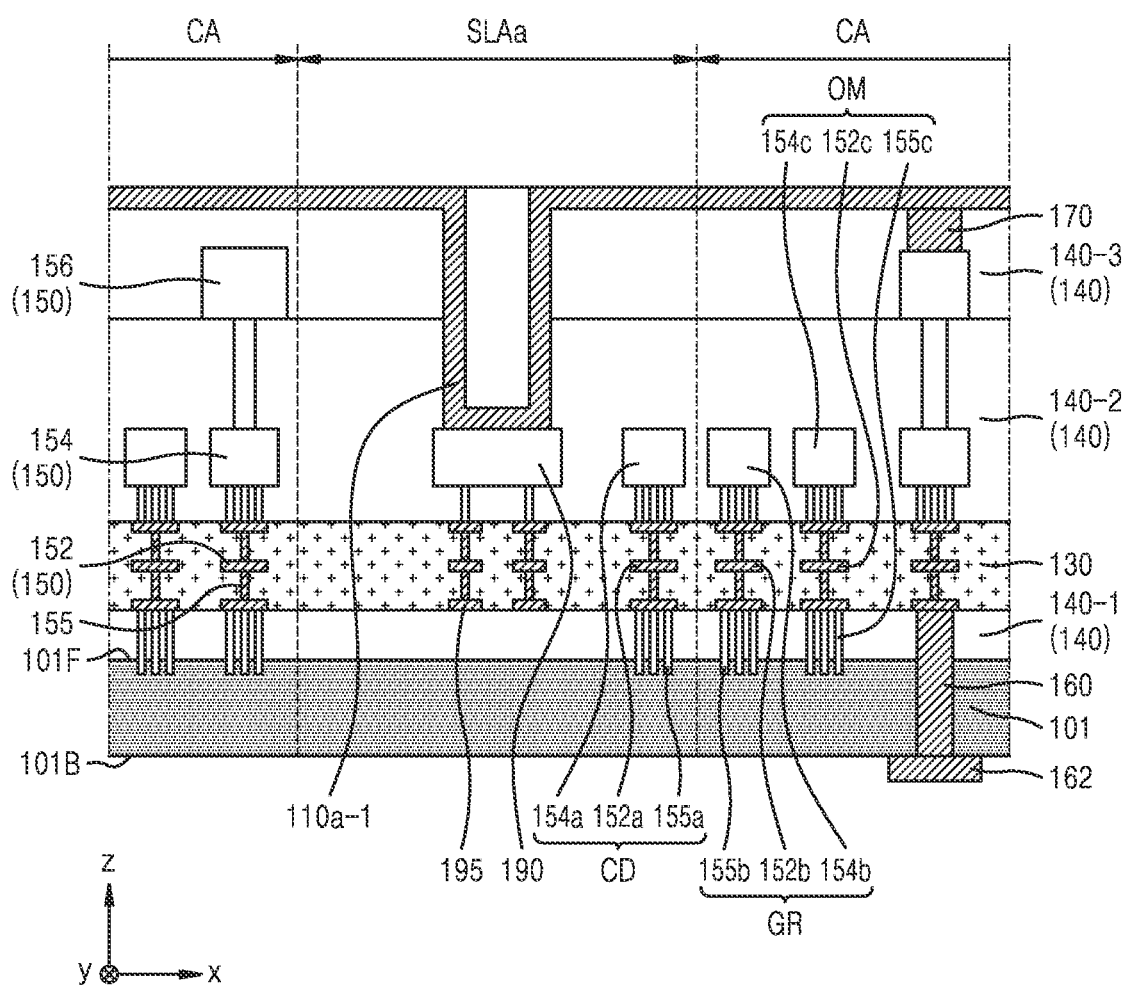
Figure 5C:
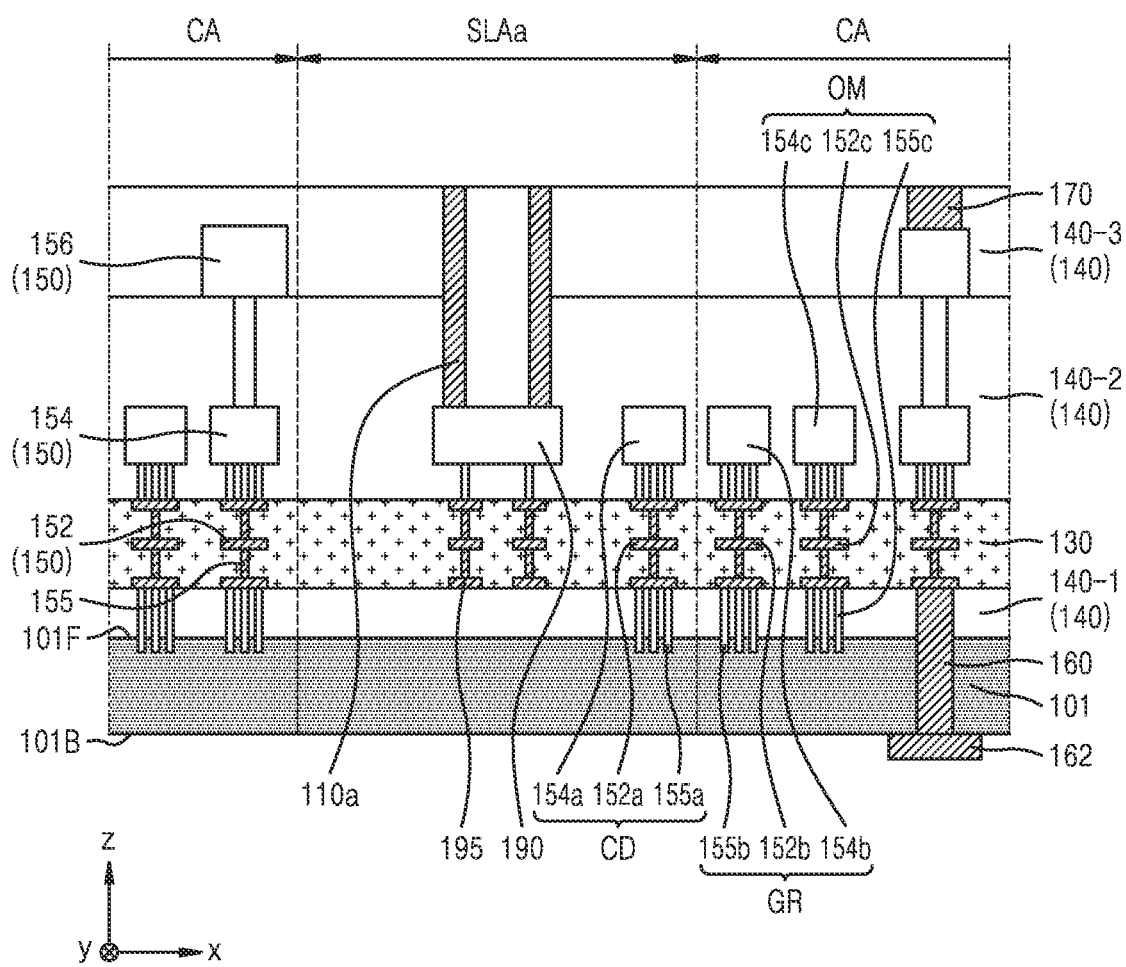

FIGS. 5A, 5B and 5C are cross-sectional views illustrating in one example a method of manufacturing the semiconductor device 100a of FIG. 3B.

In comparison with FIGS. 4A to 4F and referring to FIG. 5A, integrated circuits, the low-k layer 130, the interlayer insulating layer 140, the interconnection lines 150, the TSV 160, the Cu pad 170, and the Al pad 190 are formed on the semiconductor substrate 101. When the interconnection lines 150 are formed, the outer metal interconnection line OM and the guard ring GR of the chip area CA and the chipping dam CD of the scribe lane area SLA may be simultaneously formed. The Al pad 190 and the dummy interconnection line 195 below the Al pad 190 may also be simultaneously formed with the interconnection lines 150.

Thereafter, a second trench T2 is formed in the scribe lane area SLAa. The second trench T2 may be formed to extend through the interlayer insulating layer 140 to expose the upper surface of the Al pad 190. For example, the second trench T2 may extend through a portion of the second interlayer insulating layer 140-2 and the third interlayer insulating layer 140-3. The semiconductor device 100a of FIG. 3B may be the same as the semiconductor device 100 of FIG. 2B or may be different from the semiconductor device 100 of FIG. 2B but included in the same wafer as the semiconductor device 100 of FIG. 2B. Accordingly, the second trench T2 may be formed simultaneously with the first trench T1. However, the width of the second trench T2 may be limited to the upper surface of the Al pad 190, and therefore, may be less than the width of the first trench T1.

Referring to FIG. 5B, a metal layer 110a-1 is formed to cover the lower surface and inner side walls of the second trench T2 to a predetermined thickness. The metal layer 110a-1 may extend along the upper surface of the interlayer insulating layer 140, e.g., the third interlayer insulating layer 140-3, and the upper surface of the Cu pad 170. That is, the metal layer 110a-1 may be formed to entirely cover a structure on the semiconductor substrate 101. The metal layer 110a-1 may be formed as a single film or multiple films with the metal materials of the metal liner 110 described above.

The metal layer 110a-1 may be formed simultaneously with the metal layer 110-1 in FIG. 4C. According to an embodiment, the metal layer 110a-1 may be formed separately from the metal layer 110-1 in FIG. 4C. For example, after the metal layer 110-1 in FIG. 4C is formed, the metal layer 110a-1 may be formed.

Referring to FIG. 5C, a portion of the metal layer 110a-1 on the lower surface of the second trench T2, a portion of the metal layer 110a-1 on the upper surface of the third interlayer insulating layer 140-3, and a portion of the metal layer 110a-1 on the upper surface of the Cu pad 170 may be removed by etching. For example, the portions of the metal layer 110a-1 may be removed by dry etching. The metal liner 110a may be formed by removing the portions of the metal layer 110a-1.

The metal liner 110a may be formed simultaneously with the metal liner 110 in FIG. 4D. According to an embodiment, the metal liner 110a may be formed separately from the metal liner 110 in FIG. 4D. For example, after the metal liner 110 in FIG. 4D is formed, the metal liner 110a may be formed.

Thereafter, a process of forming an insulating layer filling the second trench T2 and a CMP process may be performed. The process of forming an insulating layer may be performed simultaneously with the insulating layer forming process described with reference to FIG. 4E, and the CMP process may be performed simultaneously with the CMP process described with reference to FIG. 4F. Due to the CMP process, the respective upper surfaces of the metal liner 110a, the gap-fill insulating layer 120a, the third interlayer insulating layer 140-3, and the Cu pad 170 may be coplanar with one another. Continuously, a GAL cutting process may be performed. Through the GAL cutting process, the semiconductor device 100a of FIG. 3B may be manufactured.

FIGS. 6A to 6E are respective cross-sectional views illustrating various semiconductor devices according to embodiments of the inventive concept in wafer states before being singulated into individual semiconductor chips.

Figure 6A:
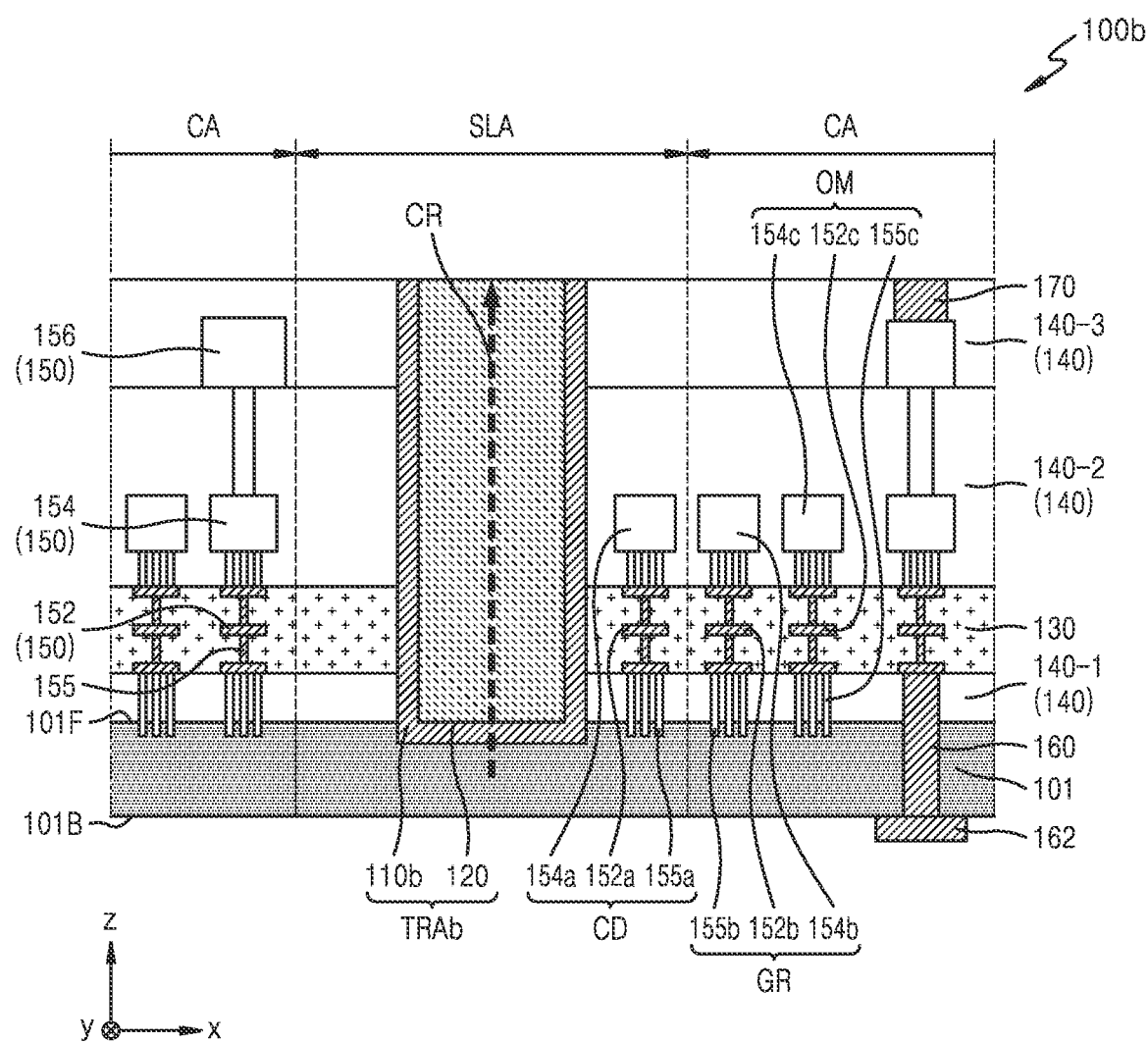
FIGS. 6A, 6B, 6C, 6D, and 6E (hereafter collectively, "FIGS. 6A to 6E") are respective cross-sectional views illustrating semiconductor devices including crack-preventing structure(s) according to embodiments of the inventive concept.

In the context of FIGS. 1 and 2A and referring to FIG. 6A, a semiconductor device 100b differs from the semiconductor device 100 of FIG. 2A in the particular structure of a trench area TRAb. That is, the trench area TRAb of the semiconductor device 100b may include a metal liner 110b and the gap-fill insulating layer 120. The shape of the gap-fill insulating layer 120 of the semiconductor device 100b may be substantially the same as the shape of the gap-fill insulating layer 120 in the trench area TRA of the semiconductor device 100 of FIG. 2A. For example, the gap-fill insulating layer 120 may extend in the second horizontal direction. The gap-fill insulating layer 120 may also vertically extend through the low-k layer 130 and the interlayer insulating layer 140.

The shape of the metal liner 110b may be different from the shape of the metal liner 110 in the trench area TRA of the semiconductor device 100 of FIG. 2A. For example, the metal liner 110b may extend from a side surface of the gap-fill insulating layer 120 to the lower surface of the gap-fill insulating layer 120. That is, the metal liner 110b may vertically extend to cover the side surface of the gap-fill insulating layer 120 and horizontally extend to cover the lower surface of the gap-fill insulating layer 120.

The structure of the metal liner 110b may be realized by reducing a dry etch time in a process of partially removing the metal layer 110-1 in FIG. 4D. Alternately, the structure of the metal liner 110b may be realized by removing, using an etch back process, only a portion of the metal layer 110-1 on the third interlayer insulating layer 140-3 and the Cu pad 170, but not removing a portion of the metal layer 110-1 on the lower surface of the first trench T1 when a width of the first trench T1 is relatively narrow.

Figure 6B:
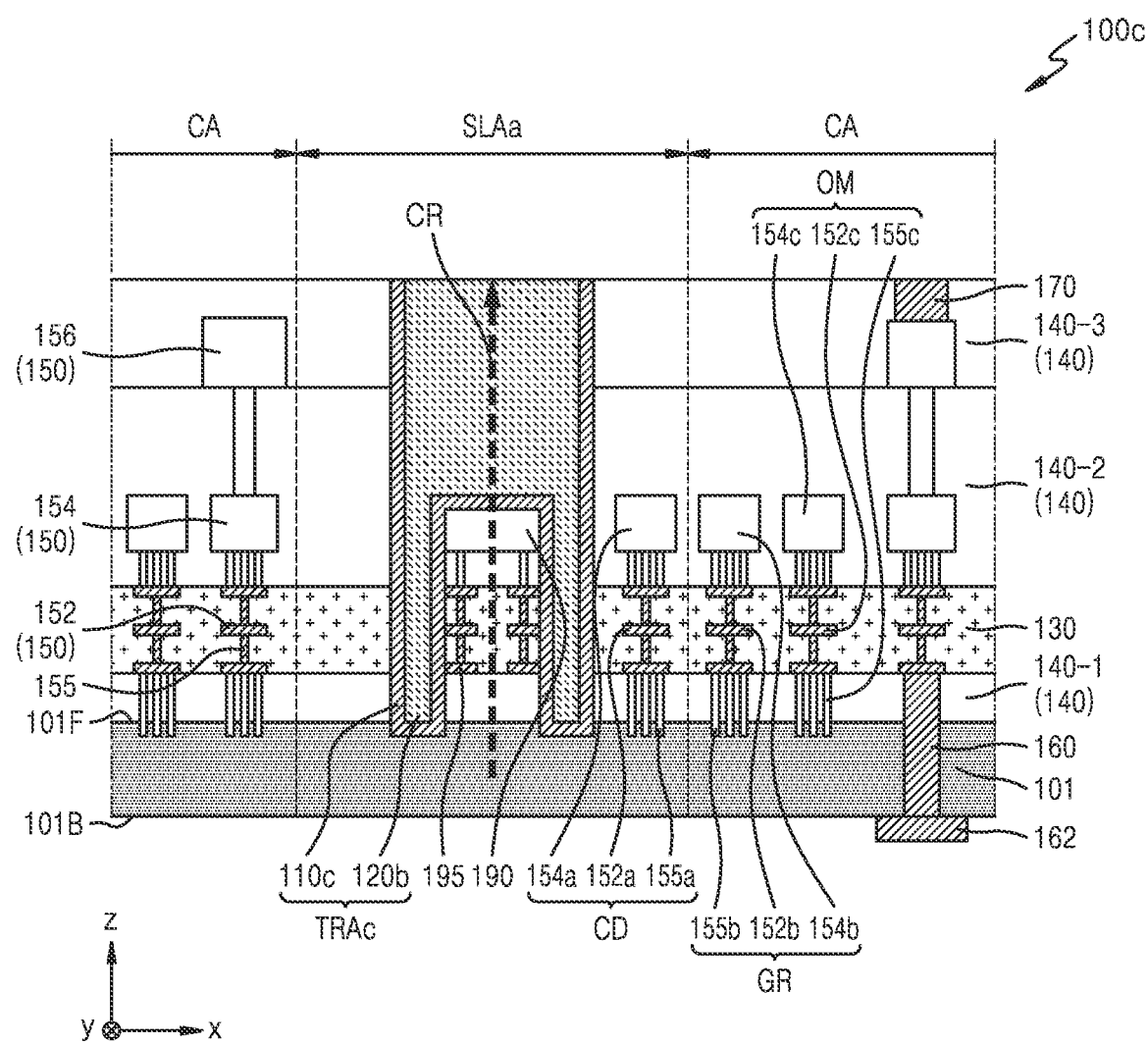

In the context of FIG. 3A and referring to FIG. 6B, a semiconductor device 100c may differ from the semiconductor device 100a of FIG. 3A in the particular structure of a trench area TRAc. That is, the trench area TRAc of the semiconductor device 100c may be formed in the scribe lane area SLAa having the Al pad 190 and may include a metal liner 110c and a gap-fill insulating layer 120b. However, the overall shape of the trench area TRAc may differ from the shape of the trench area TRAa of the semiconductor device 100a of FIG. 3A. For example, a width of the trench area TRAc may be greater than a width of the Al pad 190. Accordingly, the trench area TRAc may include a portion that extends from the Al pad 190 to the semiconductor substrate 101 below the Al pad 190.

For example, the gap-fill insulating layer 120b may include an upper gap-fill insulating layer portion above the Al pad 190 and a lower gap-fill insulating layer portion from the Al pad 190 to the semiconductor substrate 101. The metal liner 110c may include an inner metal liner portion, which extends from the semiconductor substrate 101 to the upper surface of the interlayer insulating layer 140 along a side surface of the gap-fill insulating layer 120b, and an outer metal liner portion, which extends from the Al pad 190 to the semiconductor substrate 101. Here, in a chip state following singulation, a portion of the metal liner 110c relatively close to the chip area CA may correspond to the inner metal liner portion, and a portion of the metal liner 110c that is far from the chip area CA may correspond to the outer metal liner portion. The outer metal liner portion may extend horizontally on the upper surface of the Al pad 190 and the lower surface of the lower gap-fill insulating layer portion.

In the semiconductor device 100c, the metal liner 110c may prevent cracking CR by redirecting its direction (e.g., at the interface between the Al pad 190 and the gap-fill insulating layer 120b) so as to prevent the cracking CR from penetrating into the chip area CA. Because the Al pad 190 and the dummy interconnection line 195 are disposed outside the metal liner 110c, the outer and inner metal liner portions of the metal liner 110c may doubly prevent cracking CR in a horizontal direction (e.g., at the interface between the low-k layer 130 and the interlayer insulating layer 140) from penetrating into the chip area CA.

Figure 6C:
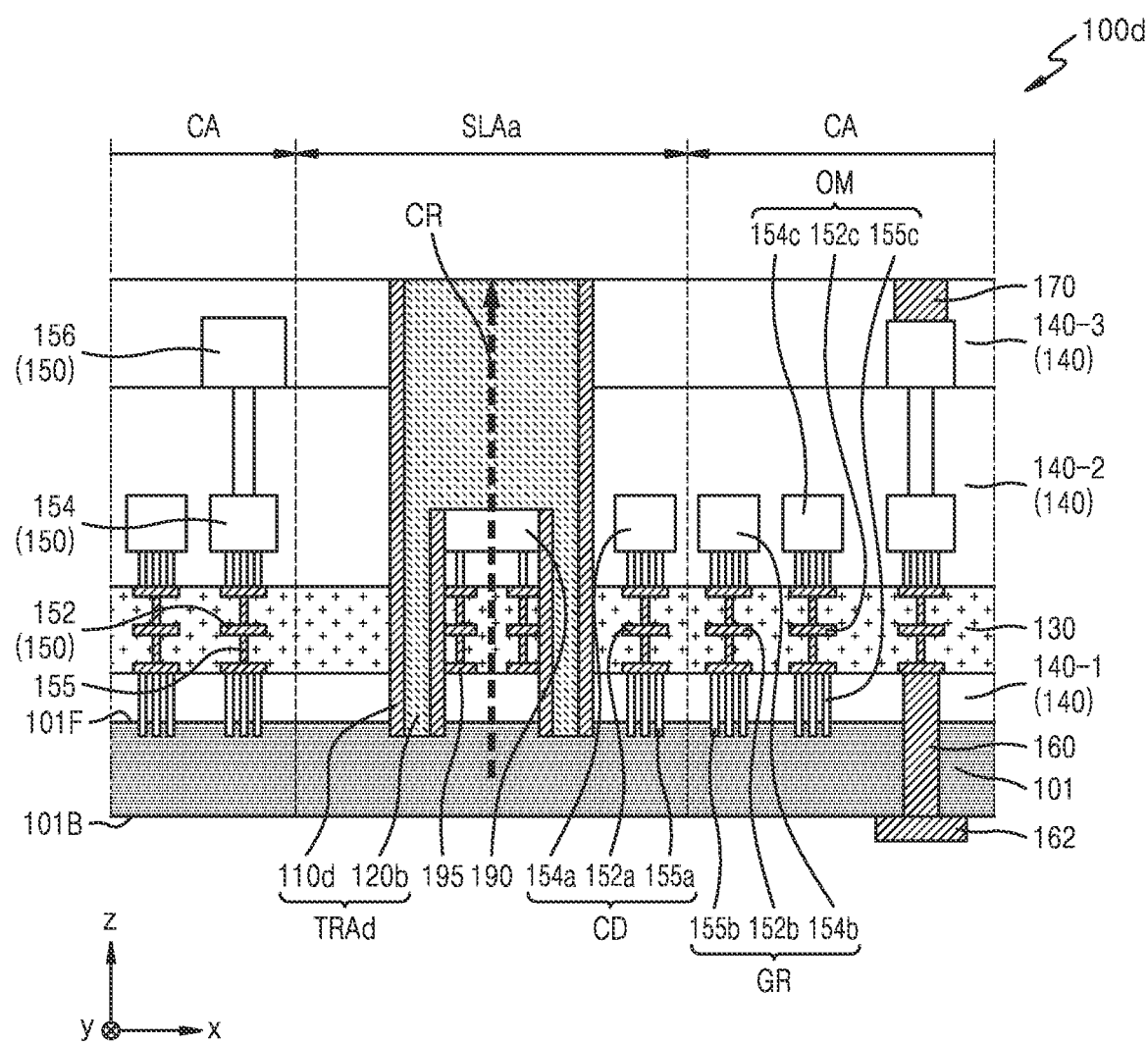

In the context of FIG. 3A and referring to FIG. 6C, a semiconductor device 100d may be differ from the semiconductor device 100c of FIG. 6B in the particular structure of a trench area TRAd. That is, the trench area TRAd of the semiconductor device 100d may be formed in the scribe lane area SLAa including the Al pad 190 and may include a metal liner 110d and the gap-fill insulating layer 120b. Here, the shape of the trench area TRAd may be substantially similar to that of the trench area TRAc of the semiconductor device 100c of FIG. 6B.

That is, the shape of the gap-fill insulating layer 120b may substantially similar to that of the gap-fill insulating layer 120b in the trench area TRAc of the semiconductor device 100c of FIG. 6B. However, the shape of the metal liner 110d may differ from the shape of the metal liner 110c in the trench area TRAc of the semiconductor device 100c of FIG. 6B. For example, an outer metal liner portion of the metal liner 110d may not extend on the upper surface of the Al pad 190 and the lower surface of the lower gap-fill insulating layer portion of the gap-fill insulating layer 120b. That is, the upper gap-fill insulating layer portion of the gap-fill insulating layer 120b may be in direct contact with the upper surface of the Al pad 190, and the lower gap-fill insulating layer portion of the gap-fill insulating layer 120b may be in direct contact with the semiconductor substrate 101.

Figure 6D:
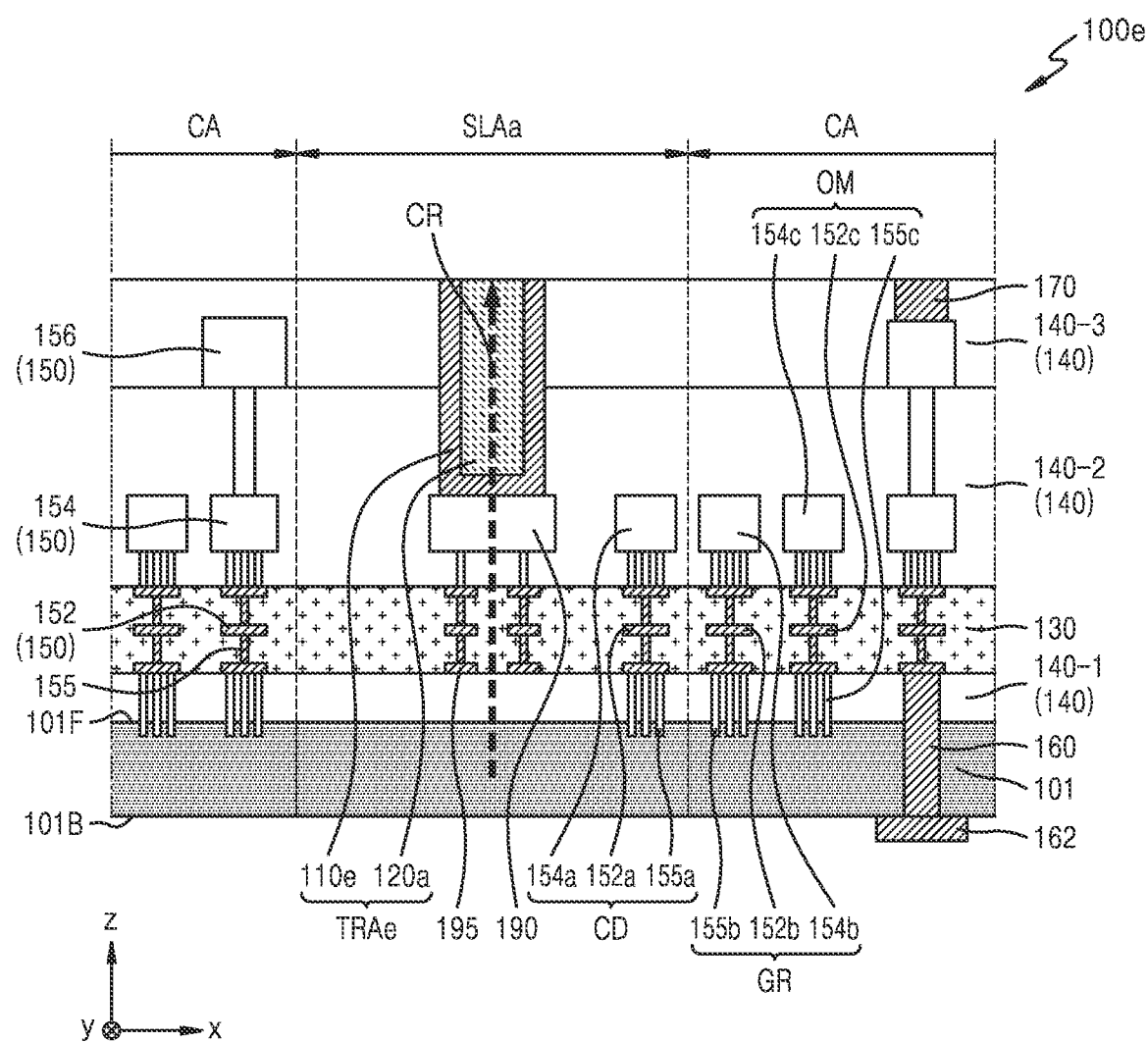

In the context of FIG. 3A and referring to FIG. 6D, a semiconductor device 100e may differ from the semiconductor device 100a of FIG. 3A in the particular structure of a trench area TRAe. Here, the trench area TRAe of the semiconductor device 100e may include a metal liner 110e and the gap-fill insulating layer 120a. The shape of the gap-fill insulating layer 120a of the semiconductor device 100e may be substantially similar to that of the gap-fill insulating layer 120a in the trench area TRAa of the semiconductor device 100a of FIG. 3A. For example, the gap-fill insulating layer 120a may vertically extend from the Al pad 190 and extend through the interlayer insulating layer 140.

The shape of the metal liner 110e may differ from the shape of the metal liner 110a in the trench area TRAa of the semiconductor device 100a of FIG. 3A. For example, the metal liner 110e may extend on the lower surface of the gap-fill insulating layer 120a. That is, the metal liner 110e may vertically extend to cover side surfaces of the gap-fill insulating layer 120a and horizontally extend on the Al pad 190 to cover the lower surface of the gap-fill insulating layer 120a.

Figure 6E:
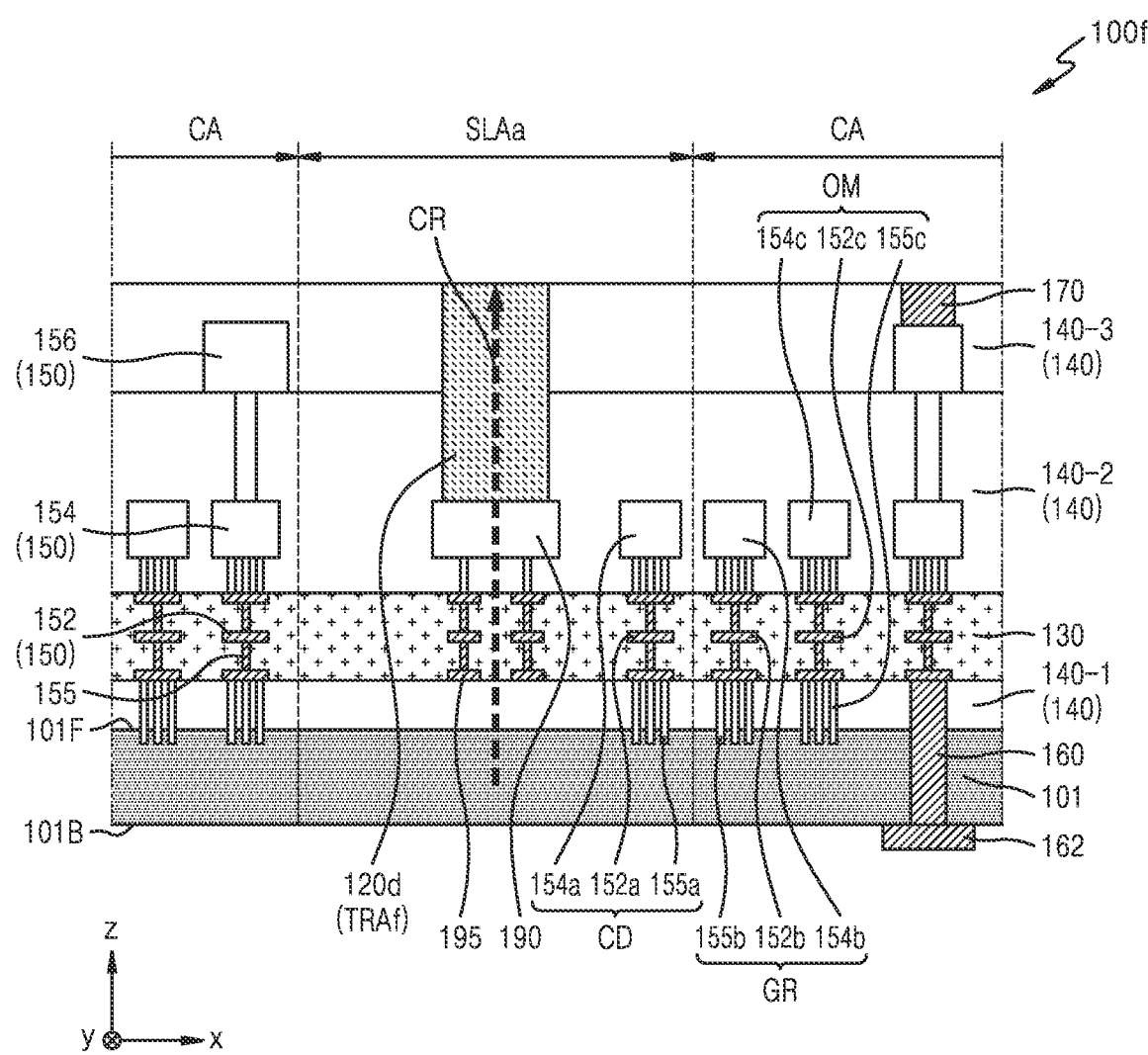

In the context of FIG. 3A and referring to FIG. 6E, a semiconductor device 100f may differ from the semiconductor device 100a of FIG. 3A in the particular structure of a trench area TRAf. Here, the trench area TRAf of the semiconductor device 100f may include only a gap-fill insulating layer 120d and omit the metal liner. The shape of the gap-fill insulating layer 120d may be substantially similar to that of the gap-fill insulating layer 120a in the trench area TRAa of the semiconductor device 100a of FIG. 3A and may vertically extend on the Al pad 190 and extend through the interlayer insulating layer 140. However, because a metal liner is not provided, a width of the gap-fill insulating layer 120d may be greater than a width of the gap-fill insulating layer 120a.

While the inventive concept has been particularly shown and described with reference to embodiments thereof, it will be understood that various changes in form and details may be made therein without departing from the spirit and scope of the following claims.

What is claimed is:

1. A semiconductor device, comprising:
 a semiconductor substrate including a chip area and a first scribe lane area;
 a low-k layer on the semiconductor substrate;
 a first trench area in the first scribe lane area, the first trench area comprising a trench;
 an interlayer insulating layer on the low-k layer;
 a first metal liner in the first scribe lane area, the first metal liner extending vertically and continuously from the semiconductor substrate through the low-k layer and the interlayer insulating layer along a sidewall of the trench; and
 a first gap-fill insulating layer in the first trench area and vertically extending from the semiconductor substrate through the low-k layer and the interlayer insulating layer to expose an upper surface of the first gap-fill insulating layer through the interlayer insulating layer,
 wherein the first metal liner covers a side surface of the first gap-fill insulating layer and is disposed between the first gap-fill insulating layer and the low-k layer and between the first gap-fill insulating layer and the interlayer insulating layer, and
 wherein a lower surface of the first gap-fill insulating layer contacts the semiconductor substrate.

2. The semiconductor device of claim 1, further comprising:
 an interconnection line structure in the chip area, wherein the interconnection line structure includes a lower interconnection line disposed in the low-k layer, an intermediate interconnection line disposed in the interlayer insulating layer, and an upper interconnection line disposed above the intermediate interconnection line in the interlayer insulating layer.

3. The semiconductor device of claim 2, further comprising:
 a copper (Cu) pad connected to the upper interconnection line, exposed through an upper surface of the interlayer insulating layer, and coplanar with upper surfaces of the first metal liner and the first gap-fill insulating layer.

4. The semiconductor device of claim 3, further comprising:
 an electrode pad disposed on a lower surface of the semiconductor substrate and electrically connected to the copper pad through the interconnection line structure.

5. The semiconductor device of claim 2, further comprising:
 at least one of a chipping dam and a guard ring is disposed in the chip area between the first trench area and the interconnection line structure.

6. The semiconductor device of claim 5, further comprising:
 an outer metal interconnection line in the chip area disposed between the interconnection line structure and the at least one of the chipping dam and the guard ring,
 wherein the outer metal interconnection line and the at least one of the chipping dam and the guard ring include at least one material simultaneously formed during fabrication of the interconnection line structure.

* * * * *